United States Patent
Yamazaki

(10) Patent No.: US 8,822,305 B2
(45) Date of Patent: Sep. 2, 2014

(54) SUBSTRATE PROVIDED WITH SEMICONDUCTOR FILMS AND MANUFACTURING METHOD THEREOF

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 740 days.

(21) Appl. No.: 12/211,945

(22) Filed: Sep. 17, 2008

(65) Prior Publication Data

US 2009/0079025 A1 Mar. 26, 2009

(30) Foreign Application Priority Data

Sep. 21, 2007 (JP) ................... 2007-245898
Sep. 21, 2007 (JP) ................... 2007-245904

(51) Int. Cl.
*H01L 21/30* (2006.01)
(52) U.S. Cl.
USPC ........... 438/455; 438/458; 438/463; 438/464; 414/806
(58) Field of Classification Search
CPC ... H01L 21/78; H01L 21/68714; H01L 21/70; H01L 21/67763; H01L 21/67333
USPC .................. 438/455, 458, 463, 464; 414/806
See application file for complete search history.

(56) References Cited

U.S. PATENT DOCUMENTS

| | | |
|---|---|---|
| 5,374,564 A | 12/1994 | Bruel |
| 6,140,210 A | 10/2000 | Aga et al. |
| 6,146,979 A | 11/2000 | Henley et al. |
| 6,159,824 A | 12/2000 | Henley et al. |
| 6,200,878 B1 | 3/2001 | Yamagata et al. |
| 6,287,941 B1 | 9/2001 | Kang et al. |
| 6,428,620 B1 | 8/2002 | Yamagata et al. |
| 6,653,209 B1 | 11/2003 | Yamagata |

(Continued)

FOREIGN PATENT DOCUMENTS

| | | |
|---|---|---|
| EP | 0926712 A | 6/1999 |
| JP | 05-047726 A | 2/1993 |

(Continued)

OTHER PUBLICATIONS

Chinese Office Action (Application No. 200810149273.7) Dated Oct. 8, 2011.

(Continued)

*Primary Examiner* — Julia Slutsker
(74) *Attorney, Agent, or Firm* — Eric J. Robinson; Robinson Intellectual Property Law Office, P.C.

(57) ABSTRACT

A plurality of single crystal semiconductor substrates having a rectangular shape are disposed on a tray. Depression portions are provided in the tray so that the single crystal semiconductor substrates can fit in. The single crystal semiconductor substrates disposed on the tray are doped with hydrogen ions, so that damaged regions are formed at a desired depth. A bonding layer is formed on surfaces of the single crystal semiconductor substrates. The plurality of single crystal semiconductor substrates in each of which the damaged region is formed and on which the bonding layer is formed are disposed on the tray and bonded to the base substrate. By heat treatment, the single crystal semiconductor substrates are separated at the damaged regions; accordingly, a plurality of single crystal semiconductor layers which are thinned are formed over the base substrate.

96 Claims, 18 Drawing Sheets

(56) References Cited

U.S. PATENT DOCUMENTS

| | | |
|---|---|---|
| 6,759,277 B1 | 7/2004 | Flores et al. |
| 6,818,529 B2 | 11/2004 | Bachrach et al. |
| 6,884,694 B2 | 4/2005 | Park et al. |
| 7,087,134 B2* | 8/2006 | Chen et al. ............... 156/281 |
| 7,109,092 B2 | 9/2006 | Tong |
| 7,119,365 B2 | 10/2006 | Takafuji et al. |
| RE39,484 E | 2/2007 | Bruel |
| 7,253,032 B2 | 8/2007 | Yamazaki et al. |
| 7,253,040 B2 | 8/2007 | Itoga et al. |
| 7,335,996 B2 | 2/2008 | Tong |
| 7,354,844 B2 | 4/2008 | Endo et al. |
| 7,485,586 B2 | 2/2009 | Yamazaki et al. |
| 7,579,654 B2 | 8/2009 | Couillard et al. |
| 7,619,250 B2 | 11/2009 | Takafuji et al. |
| 7,638,408 B2 | 12/2009 | Yamazaki et al. |
| 7,674,687 B2 | 3/2010 | Henley |
| 7,862,885 B2 | 1/2011 | Tong |
| 7,884,367 B2 | 2/2011 | Takafuji et al. |
| 7,911,016 B2 | 3/2011 | Henley |
| 7,981,766 B2 | 7/2011 | Yamazaki et al. |
| 8,012,855 B2 | 9/2011 | Henley |
| 8,048,728 B2 | 11/2011 | Yamazaki |
| 8,071,463 B2 | 12/2011 | Henley |
| 8,093,135 B2 | 1/2012 | Shimomura et al. |
| 8,124,499 B2 | 2/2012 | Henley et al. |
| 8,153,513 B2 | 4/2012 | Henley |
| 8,163,373 B2 | 4/2012 | Tong |
| 8,309,429 B2 | 11/2012 | Yamazaki |
| 2002/0070454 A1 | 6/2002 | Yasukawa |
| 2003/0183876 A1 | 10/2003 | Takafuji et al. |
| 2004/0055999 A1 | 3/2004 | Chen et al. |
| 2004/0238851 A1 | 12/2004 | Flores et al. |
| 2005/0032283 A1 | 2/2005 | Itoga et al. |
| 2005/0266659 A1 | 12/2005 | Ghyselen |
| 2005/0277296 A1* | 12/2005 | Adetutu et al. ............... 438/685 |
| 2006/0255341 A1* | 11/2006 | Pinnington et al. ............... 257/79 |
| 2006/0280591 A1* | 12/2006 | Sisson ............... 414/806 |
| 2007/0034157 A1 | 2/2007 | Nakata et al. |
| 2007/0063281 A1 | 3/2007 | Takafuji et al. |
| 2007/0092734 A1* | 4/2007 | Durandeau et al. ............... 428/432 |
| 2007/0117354 A1 | 5/2007 | Gadkaree et al. |
| 2007/0281172 A1* | 12/2007 | Couillard et al. ............... 428/446 |
| 2007/0281440 A1* | 12/2007 | Cites et al. ............... 438/458 |
| 2008/0038908 A1* | 2/2008 | Henley ............... 438/530 |
| 2008/0063840 A1 | 3/2008 | Morita |
| 2008/0160661 A1* | 7/2008 | Henley ............... 438/68 |
| 2008/0237779 A1 | 10/2008 | Yamazaki et al. |
| 2008/0237780 A1 | 10/2008 | Yamazaki et al. |
| 2008/0254560 A1 | 10/2008 | Yamazaki |
| 2009/0047771 A1 | 2/2009 | Yamazaki et al. |
| 2009/0079024 A1 | 3/2009 | Yamazaki |
| 2009/0081844 A1 | 3/2009 | Yamazaki |
| 2009/0081845 A1 | 3/2009 | Yamazaki et al. |
| 2010/0047998 A1 | 2/2010 | Yamazaki et al. |
| 2012/0183808 A1 | 7/2012 | Tong |

FOREIGN PATENT DOCUMENTS

| | | |
|---|---|---|
| JP | 05-211128 | 8/1993 |
| JP | 11-330474 | 11/1999 |
| JP | 2000-077287 A | 3/2000 |
| JP | 2003-017411 A | 1/2003 |
| JP | 2003-257804 | 9/2003 |
| JP | 2003-282885 A | 10/2003 |
| JP | 2003-332406 | 11/2003 |
| JP | 2005-203596 A | 7/2005 |
| JP | 2006-032435 A | 2/2006 |
| JP | 2007-515779 | 6/2007 |
| JP | 2009-507363 | 2/2009 |
| TW | 425628 | 3/2001 |
| TW | 200818321 | 4/2008 |
| WO | WO-2004/025360 | 3/2004 |
| WO | WO-2004/105084 | 12/2004 |
| WO | WO-2007/014320 | 2/2007 |
| WO | WO-2007/142911 | 12/2007 |
| WO | WO-2008/014339 | 1/2008 |

OTHER PUBLICATIONS

Sullivan et al., SID Digest '06 : SID International Symposium Digest of Technical Papers, "P-220L: Late-News Poster: Layer-Transfer of Silicon Single-Crystal Films on Large-Area Glass Substrates for Mobile Display Applications", Jan. 1, 2006, vol. 37, pp. 280-282.

Taiwanese Office Action (Application No. 97135885) Dated Dec. 4, 2013.

Taiwanese Office Action (Application No. 97135885) Dated Apr. 21, 2014.

* cited by examiner

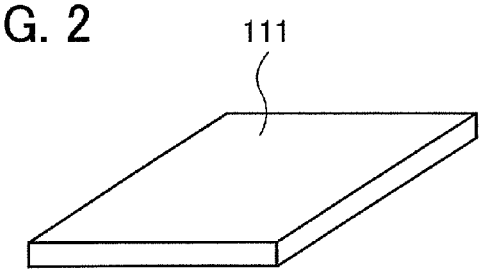
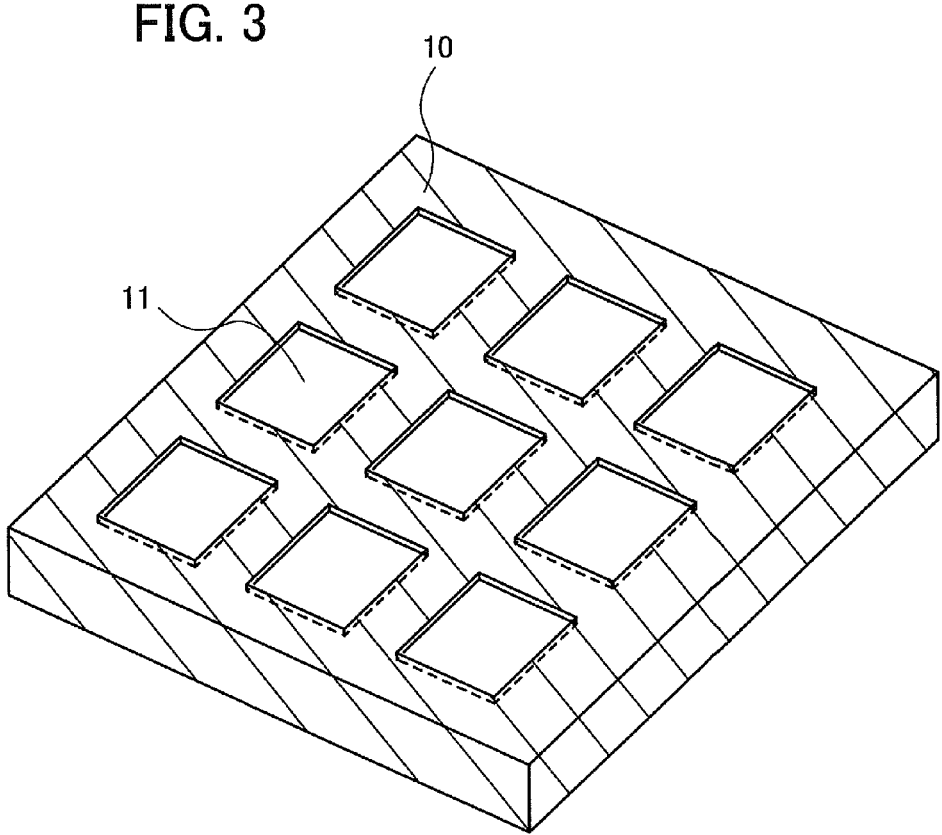

SUBSTRATE PROVIDED WITH SEMICONDUCTOR FILMS AND MANUFACTURING METHOD THEREOF

BACKGROUND OF THE INVENTION

1. Field of the Invention

The present invention relates to a substrate provided with semiconductor films and a manufacturing method thereof. The substrate provided with semiconductor films is a semiconductor substrate having a silicon-on-insulator (SOI) structure.

2. Description of the Related Art

In recent years, the development of VLSI technology has been dramatic, and SOI technology, by which increase in speed and reduction in power consumption can be realized, has been attracting attention. This technology is conventionally a technique in which an active region (channel formation region) of a field effect transistor (FET) made of a bulk single crystal silicon substrate is formed of a single crystal silicon thin film. It is known that when a MOS field effect transistor is manufactured using an SOI structure instead of a conventional bulk single crystal silicon substrate, parasitic capacitance can be reduced, and such a MOS field effect transistor is advantageous in increasing speed.

As an SOI substrate, a SIMOX substrate and a bonded substrate are known. For example, a SIMOX substrate having an SOI structure is manufactured in the following manner: oxygen ions are implanted to a bulk single crystal silicon substrate and heat treatment is performed at 1300° C. or higher to form a buried oxide (BOX) layer; accordingly, a single crystal silicon thin film is formed on a surface of the BOX layer. In the manufacture of a SIMOX substrate, although the depth of the single crystal thin film can be precisely controlled so that the single-crystal thin film can have even thickness, since implantation of oxygen ions can be controlled with precision, there are problems in terms of operation time and cost because implantation of oxygen ions takes a long time. Further, another problem is that the single crystal silicon thin film is easily damaged by oxygen ion implantation.

A bonded substrate having an SOI structure is manufactured in the following manner: two single crystal silicon substrates (a base substrate and a bond substrate) are bonded together with an oxide film interposed therebetween; and one of the single crystal silicon substrates (the bond substrate) is thinned from a rear surface (the surface that is not bonded) so that a single crystal silicon thin film is formed. As a method of thinning the substrate, it is difficult to form an evenly thin single crystal silicon thin film by grinding and polishing; therefore, a technique of utilizing hydrogen ion implantation called "Smart Cut (trademark)" has been suggested (see Patent Document 1: Japanese Published Patent Application H5-211128).

SUMMARY OF THE INVENTION

However, the size of a conventional SOI substrate depends on the size of a single crystal silicon wafer, and it is difficult to achieve size increase for conventional SOI substrates. Accordingly, an object of the present invention is to provide a substrate provided with semiconductor films, which is a substrate of a larger size than a single crystal silicon substrate, to which a plurality of single crystal semiconductor layers are bonded. Another object is to provide a manufacturing method of a substrate provided with semiconductor films, by which a plurality of single crystal semiconductor layers can be bonded to a large-area substrate efficiently.

One aspect of the substrate of the present invention provided with semiconductor films includes a base substrate, a plurality of insulating layers which are closely in contact with an upper surface of the base substrate, and a single crystal semiconductor layer which is closely in contact with an upper surface of each of the insulating layers. As the base substrate, it is preferable to use a substrate with a side that is 300 mm or longer.

One aspect of a manufacturing method of a substrate provided with semiconductor films according to the present invention includes the steps of preparing a base substrate and a plurality of single crystal semiconductor substrates of which a bonding layer is formed on upper surfaces and in each of which a damaged region is formed at a desired depth; disposing the plurality of single crystal semiconductor substrates on a tray; making the plurality of single crystal semiconductor substrates disposed on the tray in close contact with the base substrate with the bonding layer interposed therebetween to bond a surface of the bonding layer and a surface of the base substrate, so that the base substrate and the plurality of single crystal semiconductor substrates are bonded to each other; and generating a crack in the damaged regions by heating the plurality of single crystal semiconductor substrates disposed on the tray, so that the base substrate with which a plurality of first single crystal semiconductor layers separated from the single crystal semiconductor substrates are closely in contact is formed.

Another aspect of a manufacturing method of a substrate provided with semiconductor films according to the present invention includes the steps of preparing a base substrate and a plurality of single crystal semiconductor substrates of which a bonding layer is formed on upper surfaces and in each of which a damaged region is formed at a desired depth; disposing the plurality of single crystal semiconductor substrates on a first tray; making the plurality of single crystal semiconductor substrates disposed on the first tray in close contact with the base substrate with the bonding layer interposed therebetween to bond a surface of the bonding layer and a surface of the base substrate, so that the base substrate and the plurality of single crystal semiconductor substrates are bonded to each other; and generating a crack in the damaged regions by heating the plurality of single crystal semiconductor substrates disposed on the first tray, so that the base substrate with which a plurality of first single crystal semiconductor layers separated from the single crystal semiconductor substrates are closely in contact is formed.

In the formation step of the insulating layer, a plurality of single crystal substrates disposed on a second tray can be placed in a reaction chamber containing a fluoride gas or a fluorine gas, a process gas can be introduced into the reaction chamber, the process gas can be excited to generate plasma, chemical reaction of an active species included in the plasma can occur to form an insulating film having a single layer or two or more layers. The same tray or different trays may be used as the first tray and the second tray.

The fluoride gas or the fluorine gas can be contained in the reaction chamber in such a manner that the reaction chamber is cleaned by plasma gas etching using a fluoride gas or a fluorine gas so that the fluoride gas or the fluorine gas remains in the reaction chamber. Alternatively, the fluoride gas or the fluorine gas can be contained in the reaction chamber by supplying the fluoride gas or the fluorine gas into the reaction chamber.

In the above-described invention, a substrate having one side of 300 mm or longer is preferably used as the base substrate. In addition, the bonding layer is preferably formed over the insulating layer which is formed in contact with the single crystal semiconductor substrates.

A substrate of the present invention provided with semiconductor films is a substrate with an SOI structure that has a larger area than a bulk single crystal semiconductor substrate such as a Si wafer. Accordingly, by using the substrate of the present invention provided with semiconductor films, productivity of a semiconductor device such as a semiconductor integrated circuit for example, can be improved. Note that in this specification, a semiconductor device refers to devices in general that can function by utilizing semiconductor characteristics.

According to a manufacturing method of the present invention, a substrate provided with semiconductor films that has an SOI structure, which has a larger area than a bulk single crystal semiconductor substrate such as a Si wafer, can be manufactured.

BRIEF DESCRIPTION OF THE DRAWINGS

In the accompanying drawings:

FIG. 2 is an external view illustrating an example of a structure of a single crystal semiconductor substrate;

FIG. 3 is an external view illustrating an example of a structure of a tray;

DETAILED DESCRIPTION OF THE INVENTION

Figure 1:
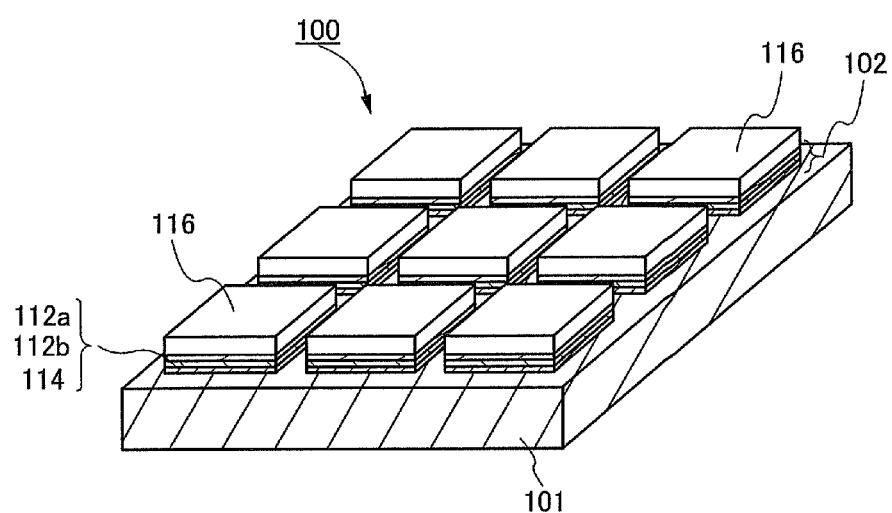
FIG. 1 is an external view illustrating an example of a structure of a substrate provided with semiconductor films.

Hereinafter, the present invention will be described. It is easily understood by those skilled in the art that the present invention can be carried out in many different modes, and modes and details disclosed herein can be modified in various ways without departing from the spirit and scope of the present invention. Therefore, the present invention should not be interpreted as being limited to the description of the embodiment modes. Note that components denoted by the same reference numerals in different drawings are the same components; therefore, repetitive descriptions on material, form, manufacturing method, and the like are omitted.

Embodiment Mode 1

In Embodiment Mode 1, a substrate provided with semiconductor films with an SOI structure, which is a substrate provided with a plurality of single crystal semiconductor layers, and a manufacturing method thereof are described.

FIG. 1 is a perspective view illustrating a structural example of a substrate 100 provided with semiconductor films. As the substrate 100 provided with semiconductor films, a plurality of single crystal semiconductor layers 116 are bonded to a base substrate 101. Each of the single crystal semiconductor layers 116 is provided over the base substrate 101 with an insulating layer 102 interposed therebetween, and the substrate 100 provided with semiconductor films is a so-called semiconductor substrate with an SOI structure. Accordingly, the substrate 100 provided with semiconductor films will hereinafter be called a "semiconductor substrate 100."

The insulating layer 102 may have a single-layer structure or a stacked-layer structure. In this embodiment mode, the insulating layer 102 has a three-layer structure. Over the base substrate 101, a bonding layer 114, an insulating film 112b, and an insulating film 112a are stacked in this order.

Each of the single crystal semiconductor layers 116 is a layer formed by thinning a single crystal semiconductor substrate. A commercially available semiconductor substrate can be used as the single crystal semiconductor substrate. For example, a single crystal semiconductor substrate made of a group 4 element such as a single crystal silicon substrate, a single crystal germanium substrate, or a single crystal silicon-germanium substrate can be used. Alternatively, a compound semiconductor substrate including gallium arsenide, indium phosphide, or the like can be used.

As the base substrate 101, a substrate having an insulating surface is used. Specifically, various glass substrates used in the electronics industry, such as substrates using aluminosilicate glass, aluminoborosilicate glass, and bariumborosilicate glass can be given, as well as a quartz substrate, a ceramic substrate, and a sapphire substrate. Preferably, a glass substrate is used as the base substrate 101. As a glass substrate, one that has a coefficient of thermal expansion of higher than or equal to $25 \times 10^{-7}/°C$. and less than or equal to $50 \times 10^{-7}/°C$. (preferably higher than or equal to $30 \times 10^{-7}/°C$. and less than or equal to $40 \times 10^{-7}/°C$.), and a distortion point at higher than or equal to 580° C. and lower than or equal to 680° C. (preferably higher than or equal to 600° C. and lower than or equal to 680° C.). Further, to suppress contamination of a semiconductor device, the glass substrate is preferably a non-alkali glass. As a material of the non-alkali glass substrate, glass materials such as aluminosilicate glass, aluminoborosilicate glass, and bariumborosilicate glass can be given, for example. Further, as the base substrate 101, an insulating substrate made of an insulator such as a ceramic substrate, a quartz substrate, or a sapphire substrate; a conductive substrate made of a conductor such as a metal or stainless steel; or a semiconductor substrate made of a semiconductor such as silicon or gallium arsenide; or the like can be used instead of a glass substrate.

As the base substrate 101, it is preferable that a substrate that is 300 mm×300 mm or larger is used. For example, as such a large-area substrate, a mother glass substrate developed for manufacturing liquid crystal panels is preferably used. Substrates with the following sizes are known as mother glass substrates, for example: $3^{rd}$ generation (550 mm×650 mm), $3.5^{th}$ generation (600 mm×720 mm), $4^{th}$ generation (680 mm×880 mm or 730 mm×920 mm), $5^{th}$ generation (1100 mm×1300 mm), $6^{th}$ generation (1500 mm×1850 mm), $7^{th}$ generation (1870 mm×2200 mm), $8^{th}$ generation (2200 mm×2400 mm), and the like. By manufacturing an SOI substrate using a large-area mother glass substrate as the base substrate 101, size increase of the SOI substrate can be realized.

Size increase of an SOI substrate can be realized by using a large-area substrate such as a mother glass substrate, as the base substrate 101. When size increase of an SOI substrate is realized, a large number of IC chips, LSI chips, or the like can be manufactured from one SOI substrate. This can greatly improve productivity since the number of chips manufactured from one substrate increases.

A manufacturing method of the semiconductor substrate 100 (the substrate 100 provided with semiconductor films) illustrated in FIG. 1 is described with reference to FIG. 2, FIG. 3, FIG. 4, FIGS. 5A and 5B, FIGS. 6A and 6B, FIGS. 7A to 7D, FIGS. 8A and 8B, FIG. 9, and FIGS. 10A and 10B.

First, a single crystal semiconductor substrate 111 is prepared. The single crystal semiconductor substrate 111 is processed into a desired size and shape. FIG. 2 is an external view illustrating an example of a structure of the single crystal semiconductor substrate 111. When the fact that the shape of the base substrate 101 to which the single crystal semiconductor substrates 111 are bonded is rectangular and a light-exposing region of a light exposure apparatus such as a reduced projection exposure apparatus is rectangular is taken into consideration, a shape of the single crystal semiconductor substrate 111 is preferably rectangular as illustrated in FIG. 2. Note that unless otherwise specified, a square is also included as a rectangle. For example, the length of a long side of the rectangular single crystal semiconductor substrate 111 is preferably processed so as to be n (n is an arbitrary positive integer, and n≥1) times the length of a side of one shot of the light-exposing region of a reduced projection exposure apparatus.

The rectangular single crystal semiconductor substrate 111 can be formed by cutting a circular, bulk single crystal semiconductor substrate that is commercially available. To cut the substrate, a cutting apparatus such as a dicer or a wire saw, a cutting means such as a laser cutter, a plasma cutter, or an electron beam cutter, or the like can be used. Alternatively, before being sliced into a substrate, an ingot for manufacturing semiconductor substrates can be processed into a rectangular solid so that it has a rectangular cross section, and this ingot that is a rectangular solid may be sliced to manufacture the rectangular single crystal semiconductor substrate 111.

Note that in the case of using as the single crystal semiconductor substrate 111 a substrate made of a group 4 element, which has a diamond structure as a crystal structure like a single crystal silicon substrate, a plane orientation of a main surface thereof may be (100), (110), or (111). By using the single crystal semiconductor substrate 111 with a main surface of (100), the interface state density between the single crystal semiconductor layer 116 and the insulating layer formed on a surface thereof can be made to be low, which is favorable in manufacturing a field effect transistor.

By using the single crystal semiconductor substrate 111 with a main surface of (110), a close bond between an element included in the insulating film 112a and a group 4 element (for example, a silicon element) included in the single crystal semiconductor layer 116 is formed on a bonded surface between the insulating film 112a and the single crystal semiconductor layer 116. Accordingly, a bond force between the bonding layer 114 and the single crystal semiconductor layer 116 is improved.

By using the single crystal semiconductor substrate 111 with a main surface of (110), planarity of the single crystal semiconductor layer 116 is improved since atoms are densely arranged on the main surface compared to surfaces of other plane orientations. Accordingly, a transistor manufactured using the single crystal semiconductor layer 116 with a main surface of (110) has excellent electric characteristics such as a small S value and a high electron field-effect mobility. Note that the single crystal semiconductor substrate with a main surface of (110) has a higher Young's modulus than the single crystal semiconductor substrate with a main surface of (100), and has an advantage that cleavage is easily formed.

Figure 4:
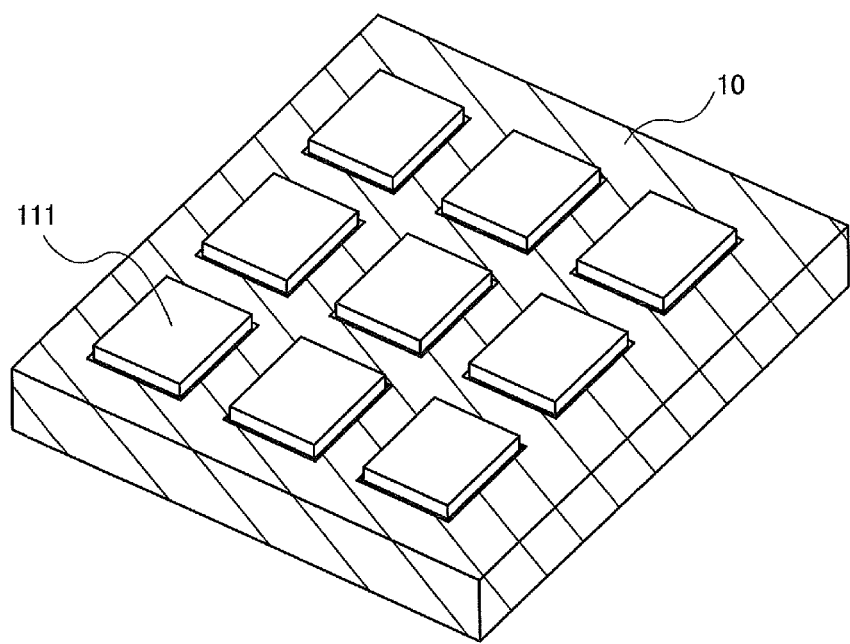
FIG. 4 is an external view illustrating a plurality of single crystal semiconductor substrates disposed on a tray.

After cleaning the single crystal semiconductor substrates 111, the plurality of single crystal semiconductor substrates 111 are disposed on a tray 10. FIG. 3 is an external view illustrating a structural example of the tray 10. The tray 10 is a plate-like member and is provided with a plurality of depression portions 11 for holding the single crystal semiconductor substrates 111. The tray illustrated in FIG. 3 is a tray for manufacturing the semiconductor substrate 100 of FIG. 1, in which depression portions 11 are formed in three rows and three columns. As illustrated in FIG. 4, the single crystal semiconductor substrates 111 are disposed on the tray 10 so as to fit in the depression portions 11. FIG. 4 is an external view illustrating the state where the plurality of single crystal semiconductor substrates 111 are disposed on the tray 10.

The tray 10 is manufactured using a material which does not change its quality and shape by heat treatment in a manufacturing process of the semiconductor substrate 100. In particular, a material which does not expand much by heat treatment is preferably selected. For example, the tray 10 can be manufactured using quartz glass, stainless steel, non-alkali glass, or the like.

The thickness of the tray 10 can be equal to or greater than 1.1 mm and equal to or less than 2 mm. The depth of the depression portions 11 can be equal to or greater than 0.2 mm and equal to or less than 0.6 mm, and preferably equal to or greater than 0.3 mm and equal to or less than 0.5 mm. The tray 10 preferably has the same size as the base substrate 101. The depression portions 11 may have such a size that the single crystal semiconductor substrates 111 fit in the depression portions 11. As illustrated in FIG. 4, the size and array of the single crystal semiconductor layers 116 of the semiconductor substrate 100 are restricted by the size and array of the depression portions 11 in the manufacturing method of this embodiment mode.

Figure 5A:
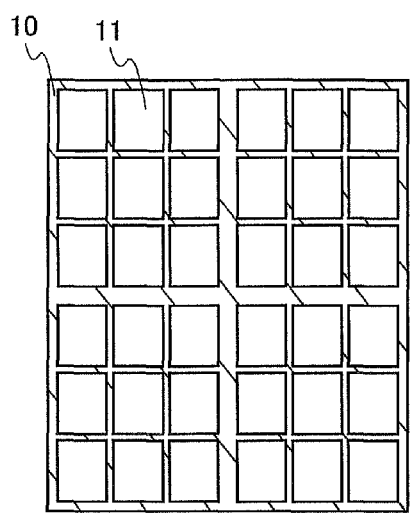
FIGS. 5A and 5B are each a top view illustrating a structural example of a tray.
Figure 5B:
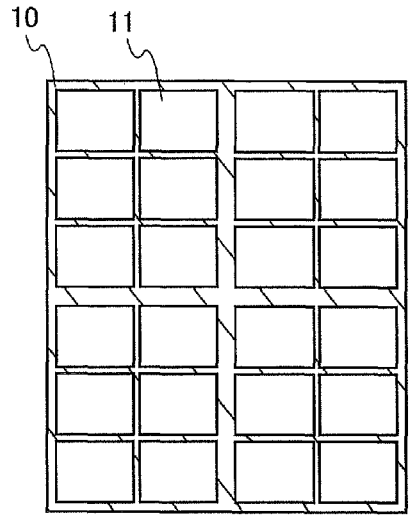
Figure 6A:
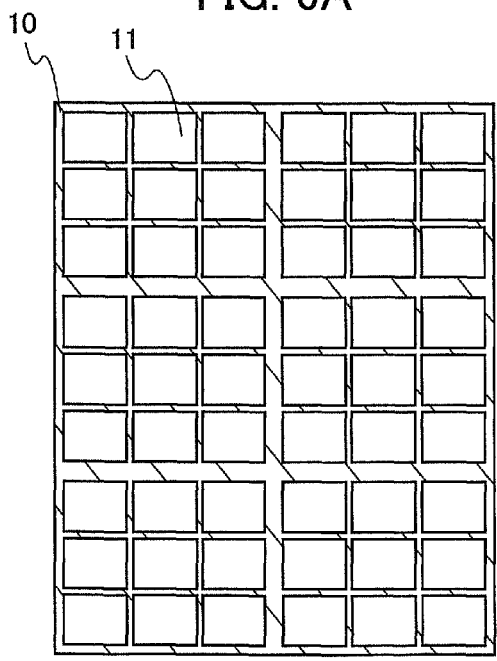
FIGS. 6A and 6B are each a top view illustrating a structural example of a tray.
Figure 6B:
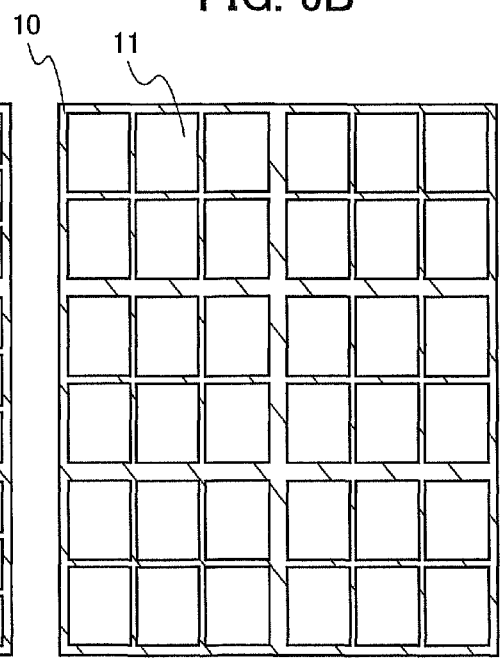

FIGS. 5A and 5B, and FIGS. 6A and 6B are top views illustrating structural examples of the tray 10. FIGS. 5A and 5B are plane views of the tray 10 in the case of using a mother glass substrate having a size of 600 mm×720 mm as the base substrate 101, where the tray 10 has a size of 600 mm×720 mm. FIGS. 6A and 6B are plane views of the tray 10 in the case of using a fourth generation mother glass substrate having a size of 730 mm×920 mm as the base substrate 101, where the tray 10 has a size of 730 mm×920 mm.

FIG. 5A is a plane view of the tray 10 which is selected in consideration of the size and array of the depression portions 11 in order to correspond with a reduced-projection light exposure apparatus having a light exposure region size of 4 inches on each side. The tray 10 is divided into four blocks, and nine depression portions 11 are formed in three rows and three columns in each block. Each of the depression portions 11 has a size of 102 mm×82 mm so as to fit in a light exposure region of one shot. In one block, the distances between adjacent depression portions 11 in rows and in columns are both 11 mm, and the distances from sides of the tray 10 to sides of the depression portions 11 closest to the sides of the tray 10 in a longitudinal direction and in a lateral direction are both 16 mm.

FIG. 5B is a plane view of the tray 10 selected in consideration of the size and array of the depression portions 11 in order to correspond with a reduced-projection light exposure apparatus having a light exposure region size of 5 inches on each side. The tray 10 is divided into four blocks, and six depression portions 11 are formed in three rows and two columns in each block. Each of the depression portions 11 has a size of 102 mm×130 mm so as to fit in a light exposure region of one shot. In one block, the distances between the adjacent depression portions 11 in columns are 11 mm, and the distances between adjacent depression portions 11 in rows are 10 mm. The distances from sides of the tray 10 to sides of the depression portions 11 closest to the sides of the tray 10 in a longitudinal direction and in a lateral direction are both 16 mm.

FIG. 6A is a plane view of the tray 10 which is selected in consideration of the size and array of the depression portions 11 in order to correspond with a reduced-projection light exposure apparatus having a light exposure region size of 4 inches on each side. The tray 10 is divided into six blocks, and nine depression portions 11 are formed in three rows and three columns in each block. Each of the depression portions 11 has a size of 105 mm×84 mm so as to fit in a light exposure region of one shot. In one block, the distances between the adjacent depression portions 11 in columns are 10 mm, and the distances between adjacent depression portions 11 in rows are 10 mm. The distances from sides of the tray 10 to sides of the depression portions 11 closest to the sides of the tray 10 in a longitudinal direction are 16 mm, and the distances from sides of the tray 10 to sides of the depression portions 11 closest to the sides of the tray 10 in a lateral direction are 15 mm.

FIG. 6B is a plane view of the tray 10 selected in consideration of the size and array of the depression portions 11 in order to correspond with a reduced-projection light exposure apparatus having a light exposure region size of 5 inches on each side. The tray 10 is divided into six blocks, and six depression portions 11 are formed in two rows and three columns in each block. Each of the depression portions 11 has a size of 132 mm×105 mm so as to fit in a light exposure region of one shot. In one block, the distances between the adjacent depression portions 11 in columns are 13 mm, and the distances between adjacent depression portions 11 in rows are 10 mm. The distances from sides of the tray 10 to sides of the depression portions 11 closest to the sides of the tray 10 in a longitudinal direction and in a lateral direction are both 15 mm.

Figure 7A:
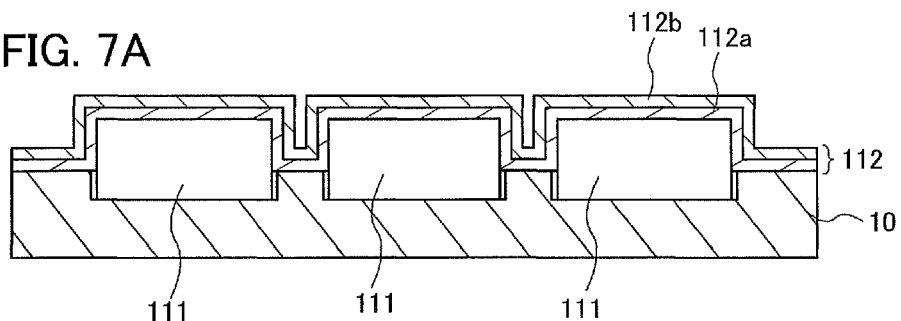
FIGS. 7A to 7D are cross-sectional views illustrating a manufacturing method of a substrate provided with semiconductor films.

Hereinafter, a manufacturing method of the semiconductor substrate 100 after disposing the single-crystal semiconductor substrates 111 on the tray 10 as illustrated in FIG. 3 will be described with reference to the cross-sectional views of FIG. 7A to FIG. 10B. First, as illustrated in FIG. 7A, the insulating layer 112 is formed over the single crystal semiconductor substrates 111. The insulating layer 112 can have a single-layer structure or a multi-layer structure of two more layers. The thickness of the insulating layer 112 can be more than or equal to 5 nm and less than or equal to 400 nm. As the insulating layer 112, an insulating film containing silicon or germanium in its composition, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Alternatively, an insulating film made of a metal oxide such as aluminum oxide, tantalum oxide, or hafnium oxide; an insulating film made of a metal nitride such as aluminum nitride; an insulating film made of a metal oxynitride such as an aluminum oxynitride film; or an insulating film made of a metal nitride oxide such as an aluminum nitride oxide film, can be used.

Note that in this specification, an oxynitride is a substance with a composition in which the number of oxygen atoms is more than the number of nitrogen atoms, and a nitride oxide is a substance with a composition in which the number of nitrogen atoms is more than the number of oxygen atoms. For example, silicon oxynitride is a substance including oxygen, nitrogen, silicon, and hydrogen in ranges of 50 at. % to 65 at. % inclusive, 0.5 at. % to 20 at. % inclusive, 25 at. % to 35 at. % inclusive, and 0.1 at. % to 20 at. % inclusive, respectively. Further, silicon nitride oxide is a substance including oxygen, nitrogen, silicon, and hydrogen in ranges of 5 at. % to 30 at. % inclusive, 20 at. % to 55 at. % inclusive, 25 at. % to 35 at. % inclusive, and 10 at. % to 30 at. % inclusive, respectively. Note that compositions of an oxynitride and a nitride oxide can be measured using Rutherford backscattering spectrometry (RBS) and hydrogen forward scattering (HFS). Note that percentages of oxygen, nitrogen, hydrogen, and silicon are values when the total number of atoms contained in the silicon oxynitride or silicon nitride oxide is defined as 100 at. %.

The insulating film forming the insulating layer 112 can be formed by a CVD method, a sputtering method, a method of oxidizing or nitriding the single crystal semiconductor substrate 111, or the like.

In the case of using as the base substrate 101 a substrate containing an impurity such as an alkali metal or an alkaline-earth metal that reduces reliability of a semiconductor device, the insulating layer 112 is preferably provided with at least one layer of a film that can prevent such an impurity from diffusing into the semiconductor layers of the SOI substrates from the base substrate 101. As such a film, a silicon nitride film, a silicon nitride oxide film, an aluminum nitride film, an aluminum nitride oxide film, or the like can be given. By including such a film, the insulating layer 112 can function as a barrier layer.

For example, in the case of forming the insulating layer 112 as a barrier layer with a single-layer structure, a silicon nitride film, a silicon nitride oxide film, an aluminum nitride film, or an aluminum nitride oxide film can be formed with a thickness of 5 nm to 200 nm inclusive.

In the case of forming the insulating layer 112 as a barrier layer with a two-layer structure, an upper layer is formed of an insulating film with a high barrier function. As such an insulating film, a silicon nitride film, a silicon nitride oxide film, an aluminum nitride film, or an aluminum nitride oxide film can be formed with a thickness of 5 nm to 200 nm inclusive. These films have high blocking effects that prevent diffusion of impurity, but have high internal stress. Therefore, as an insulating film of a lower layer that is in contact with the single crystal semiconductor substrate 111, it is preferable to select a film that has an effect of alleviating the stress of an insulating film of the upper layer. As such an insulating film, a silicon oxide film, a silicon nitride film, a thermally oxidized film formed by thermally oxidizing the single crystal semiconductor substrate 111, and the like can be given. The thickness of the insulating film of the lower layer can be 5 nm to 300 nm inclusive.

In this embodiment mode, the insulating layer 112 has a two-layer structure including the insulating film 112a and the insulating film 112b. As combinations of the insulating film 112a that serves as a blocking film and the insulating film 112b in the insulating layer 112, the following can be given as examples. A silicon oxide film and a silicon nitride film, a silicon oxynitride film and a silicon nitride film, a silicon oxide film and a silicon nitride oxide film, a silicon oxynitride film and a silicon nitride oxide film, and the like.

For example, the insulating film 112a of the upper layer can be formed of a silicon oxynitride film that is formed by a plasma-excitation CVD method (hereinafter referred to as "PECVD method") using $SiH_4$ and $N_2O$ for process gases. Alternatively, as the insulating film 112a, a silicon oxide film can be formed by a PECVD method using organosilane and oxygen as process gases. Further alternatively, the insulating film 112a may be formed of an oxide film formed by oxidizing the single crystal semiconductor substrates 111.

Organosilane is a compound such as the following: tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like.

The insulating film 112b of the lower layer can be formed of a silicon nitride oxide film that is formed by a PECVD method using $SiH_4$, $N_2O$, $NH_3$, and $H_2$ as process gasses, or a silicon nitride film that is formed by a PECVD method using $SiH_4$, $N_2$, $N_3$, and $H_2$ as process gasses.

For example, in the case of forming the insulating film 112a made of a silicon oxynitride and the insulating film 112b made of silicon nitride oxide by a PECVD method, the plurality of single crystal semiconductor substrates 111 are carried into a treatment chamber of a PECVD apparatus. Then, $SiH_4$ and $N_2O$ are supplied to the treatment chamber as process gasses for forming the insulating film 112a, plasma of these process gases are generated, and a silicon nitride oxide film is formed over the single crystal semiconductor substrates 111. Next, gases introduced into the treatment chamber are switched to gases for a process for forming the insulating film 112b. Here, $SiH_4$, $NH_3$, $H_2$ and $N_2O$ are used. Plasma of a mixed gas of these gases is generated, and a silicon nitride oxide film is formed over the silicon oxynitride film without a break. Also, in the case of using a PECVD apparatus with plural treatment chambers, the silicon oxynitride film and the silicon nitride oxide film can be formed in different treatment chambers. Of course, by switching the gases introduced to the treatment chamber, a silicon oxide film can be formed as the lower layer and a silicon nitride film can be formed as the upper layer.

By forming the insulating film 112a and the insulating film 112b in the above manner, the insulating layer 112 can be formed over the plurality of single crystal semiconductor substrates 111 in favorable throughput. Further, because the insulating film 112a and the insulating film 112b can be formed without being exposed to air, contamination of an interface between the insulating film 112a and the insulating film 112b by air can be prevented.

Alternatively, an oxide film formed by oxidizing the single crystal semiconductor substrates 111 can be used as the insulating film 112a. Thermal oxidation treatment for forming this oxide film may be dry oxidation, but adding a gas containing halogen into an oxygen atmosphere is preferable. As the gas containing halogen, one type or plural types of gasses selected from the following can be used: HCl, HF, $NF_3$, HBr, Cl, ClF, $BCl_3$, F, $Br_2$, and the like.

For example, heat treatment is performed at 700° C. or higher, in an atmosphere containing HCl at 0.5% to 10% by volume (preferably 3% by volume) with respect to oxygen. It is preferable that the thermal oxidation is performed at a heating temperature of 950° C. to 1100° C. inclusive. Treatment time may be 0.1 to 6 hours, preferably 0.5 to 1 hour. The thickness of the oxide film that is formed can be made to be 10 nm to 1000 nm (preferably 50 nm to 200 nm), for example, 100 nm.

By performing oxidation treatment in such a temperature range, a gettering effect by a halogen element can be obtained. As the gettering effect, there is an effect of removing a metal impurity in particular. That is, by the action of chlorine, an impurity such as metal or the like turns into volatile chloride, and then is released into an air phase and removed from the single crystal semiconductor substrate 111. Also, by the halogen element used in the oxidation treatment, a dangling bond on a surface of the single crystal semiconductor substrate 111 is terminated, and localized level density at an interface of the oxide film and the single crystal semiconductor substrate 111 can be reduced.

By this thermal oxidation treatment in an atmosphere containing halogen, the oxide film can contain halogen. By containing a halogen element at a concentration of $1 \times 10^{17}$ atoms/$cm^3$ to $5 \times 10^{20}$ atoms/$cm^3$, the oxide film can manifest a function of a protective film that prevents contamination of the single crystal semiconductor layer 116 by capturing an impurity such as a metal, in the semiconductor substrate 100.

As an example of a method for forming the insulating film 112a, which is a lower layer, by thermal oxidation treatment and the insulating film 112b, which is an upper layer, by a vapor deposition method such as a PECVD method, the following method can be used: the insulating film 112a is formed by thermal oxidation treatment before disposing the single crystal semiconductor substrates 111 on the tray 10, the single crystal semiconductor substrates 111 on which the insulating film 112a of oxide film has been formed are disposed on the tray 10, and then the insulating film 112b is formed.

In this embodiment mode, at least one of the insulating films included in the insulating layer 112 having a single-layer structure or stacked structure is preferably an insulating film containing fluorine. In particular, a layer of the insulating layer 112, which is in contact with the single crystal semiconductor substrates 111, is preferably formed using an insulating film containing fluorine. In the case of this embodiment mode, fluorine can be contained in the insulating film 112a by forming the insulating film 112a in a reaction chamber of a PECVD apparatus which contains a fluoride gas or a fluorine gas. A process gas for forming the insulating film 112a is introduced into such a reaction chamber, this process gas is excited to generate plasma, and chemical reaction of an active species included in the plasma is caused, so that the insulating film 112a is formed on the single crystal semiconductor substrates 111.

A fluorine compound gas can be contained in a reaction chamber of a PECVD apparatus by cleaning the reaction chamber by plasma gas etching using a fluoride gas. When a film is formed by a PECVD apparatus, products generated by reaction of a source material are deposited on not only the surface of the substrate but also an inner wall of the reaction chamber, an electrode, a substrate holder, and the like. These deposited products are a cause of particles and dust. Therefore, a cleaning step for removing such deposited products is carried out regularly. As a typical cleaning method of a reaction chamber, a method using plasma gas etching can be given. This is a method in which a fluoride gas such as $NF_3$ is introduced into a reaction chamber, the fluoride gas is excited to generate plasma so that fluorine radicals are generated, and deposited products are etched so as to be removed. Since the fluoride generated by reaction with the fluorine radicals has a high vapor pressure, the fluoride is removed from the reaction chamber through an exhaust system.

In conducting cleaning by plasma gas etching, a fluoride gas used as a cleaning gas is adsorbed on the inner wall of the reaction chamber and the electrode and various tools provided in the reaction chamber. That is, a fluoride gas can be contained in the reaction chamber. Note that as the method for making the fluoride gas be contained in the reaction chamber, a method in which a fluoride gas is introduced into a reaction chamber after providing the single crystal semiconductor substrates 111, which are disposed on the tray 10, in a reaction chamber can be used as well as the method in which the reaction chamber is cleaned with a fluoride gas and the fluoride gas is made to remain in the reaction chamber.

For example, in the case where a silicon oxynitride film is formed by a PECVD method using $SiH_4$ and $N_2O$ as the insulating film 112a, $SiH_4$ and $N_2O$ are supplied to a reaction chamber, these gases are excited to generate plasma, and accordingly the fluoride gas remaining in the reaction chamber is also excited to form fluorine radicals. Thus, the silicon oxynitride film can contain fluorine. Further, a slight amount of fluoride remains in the reaction chamber, and the fluoride is not supplied during formation of the silicon oxynitride film. Therefore, fluorine is introduced in the early stage of the formation of the silicon oxynitride film. In this manner, in the insulating film 112a, the concentration of fluorine can be heightened at an interface between the single crystal semiconductor substrates 111 and the insulating film 112a (the insulating layer 112) or in the vicinity of the interface. That is, in the insulating layers 112 of the semiconductor substrate 100 illustrated in FIG. 1, the fluorine concentration can be heightened at an interface with the single crystal semiconductor layers 116 or in the vicinity of the interface.

Dangling bonds in the semiconductor at the interface with the single crystal semiconductor layers 116 can be terminated with fluorine by making such a region contain fluorine; accordingly, the interface state density between the single crystal semiconductor layers 116 and the insulating layer 112 can be reduced. In addition, even in the case where metal such as sodium diffuses into the insulating layer 112 from the base substrate 101, if fluorine exists, the metal can be caught by the fluorine, thereby preventing the single crystal semiconductor layers 116 from being contaminated by the metal.

Instead of the fluoride gas, a fluorine ($F_2$) gas can also be contained in the reaction chamber. The fluoride is a compound containing fluorine (F) in its composition. As the fluoride gas, a gas selected from $OF_2$, $ClF_3$, $NF_3$, $FNO$, $F_3NO$, $SF_6$, $SF_5NO$, $SOF_2$, or the like can be used. Alternatively, any of the following fluorine compound gases containing carbon in its composition can be used as the fluoride gas: perfluorocarbon (PFC), hydrofluorocarbon (HFC), hydrochlorofluorocarbon (HCFC), ether fluoride, carbonyl fluoride, and ester fluoride.

As perfluorocarbon, $CF_4$, $C_2F_6$, $C_3F_8$, $C_4F_{10}$, $C_3F_8$, $C_4F_6$, $C_4F_8$, $C_5F_8$, or the like can be used. As hydrofluorocarbon, $CF_3CHF_2$, $CHF_2CHF_2$, $CF_3CHFCF_3$, $CF_3CF_2CHF_2$, $CHF_2CF_2CHF_2$, or the like can be used. As ether fluoride, hydrofluoroether (HFE) such as $CHF_2OCHF_2$, $CF_3OCHFCF_3$; $CF_3OCF{=}CF_2$, $C_2F_5OCF{=}CF_2$, $C_3F_6O$, $C_3F_6O_2$, $C_4F_8O$, $C_4F_8O_2$, or the like can be used. As carbonyl fluoride, $CF_3COCF_3$ or the like can be used. As ester fluoride, $CF_3COOCHF_2$, $CF_3COOC_2F_5$, or the like can be used.

As the fluorine compound gas containing carbon in its composition, a gas selected from $COF_2$, $CF_3COF$, $CF_2(COF)_2$, $C_3F_7COFCF_3OF$, $CF_3I$, $CF_3OOCF_3$, $CF_3OOOCF_3$, $CF_3CN$, $CF_3NO$, or the like can also be used.

Next, a step of forming a damaged region 113 in each of the single crystal semiconductor substrates 111 is described with reference to FIG. 7B. An ion beam 121, which is made of ions that are accelerated by an electric field, is emitted to the single crystal semiconductor substrates 111 through the insulating layer 112, to form the damaged regions 113 in a region that is at a predetermined depth from surfaces of the single crystal semiconductor substrates 111. This ion irradiation step is a step in which the single crystal semiconductor substrates 111 are irradiated with the ion beam 121 made of an accelerated ion species, to add an element included in the ion species to the single crystal semiconductor substrates 111. Accordingly, when the ion beam 121 is emitted to the single crystal semiconductor substrates 111, an embrittled layer in which a crystal structure is brittle is formed at a predetermined depth in each of the single crystal semiconductor substrates 111 by impact of the accelerated ion species. This layer is the damaged region 113. The ion beam 121 is generated by exciting a source gas to generate plasma of the source gas, and then extracting ions contained in the plasma by an effect of an electric field.

The depth of the region in which the damaged region 113 is formed can be adjusted by controlling acceleration energy and incidence angle of the ion beam 121. The acceleration energy can be adjusted by controlling acceleration voltage, dose, or the like. The damaged region 113 is formed in a region that is at about the same depth as the average penetration depth of the ions. The thickness of a semiconductor layer that is separated from the single crystal semiconductor substrate 111 is set depending on the depth to which the ions are added. The depth at which the damaged region 113 is formed is in the range of 50 nm to 500 nm inclusive, preferably 50 nm to 200 nm inclusive.

In adding the ions to the single crystal semiconductor substrates 111, it is preferable to use an ion doping method that does not involve mass separation, instead of an ion implantation method that does. This is because tact time for forming the damaged regions 113 in the plurality of single crystal semiconductor substrates 111 disposed on the tray 10 having a large area can be shortened.

The single crystal semiconductor substrates 111 fitted in the tray 10 is carried into an ion doping apparatus. Then, a source gas is excited to generate plasma, and an ion species is extracted from the plasma and accelerated to generate the ion beam 121. The ion beam 121 is emitted to the plurality of single crystal semiconductor substrates 111; consequently, the ions are introduced to a region at a predetermined depth at a high concentration, and the damaged regions 113 are formed in the single crystal semiconductor substrates 111.

In the case of using hydrogen ($H_2$) for the source gas, the hydrogen gas can be excited to generate plasma containing $H^+$, $H_2^+$, and $H_3^+$. The ratio of ion species generated from the source gas can be varied by adjusting an excitation method of plasma, pressure of an atmosphere in which plasma is generated, supply quantity of a source gas, or the like. When the total amount of $H^+$, $H_2^+$, and $H_3^+$ contained in the ion beam 121 is defined as 100%, $H_3^+$ is preferably included at more than or equal to 50%, and further preferably at more than or equal to 80%.

Since $H_3^+$ has a larger number of hydrogen atoms compared to the other hydrogen ion species ($H^+$, and $H_2^+$) and therefore has a larger mass, in the case of being accelerated with the same energy, $H_3^+$ is implanted in a shallower region of the single crystal semiconductor substrate 111 compared to $H^+$, and $H_2^+$. Therefore, by a high percentage of $H_3^+$ contained in the ion beam 121, variation in the average penetration depth of the hydrogen ions becomes small; accordingly, a concentration profile of hydrogen in a depth direction in the single crystal semiconductor substrates 111 becomes steep, and a peak position of the profile can be made to be shallow. Consequently, it is preferable that when the total amount of $H^+$, $H_2^+$, and $H_3^+$ contained in the ion beam 121 is defined as 100%, $H_3^+$ is preferably included at more than or equal to 50%, and further preferably at more than or equal to 80%.

In the case of performing ion addition by an ion doping method using hydrogen gas, the acceleration voltage can be 10 kV to 200 kV inclusive, and the dose can be $1 \times 10^{16}$ ions/cm² to $6 \times 10^{16}$ ions/cm² inclusive. By adding hydrogen ions under this condition, the damaged regions 113 can be formed in a region in the single crystal semiconductor substrates 111 that is at a depth of 50 nm to 500 nm inclusive, although it depends on an ion species contained in the ion beam 121 and the percentage thereof.

For example, in the case in which the single crystal semiconductor substrates 111 are single crystal silicon substrates, the insulating film 112a is a silicon oxynitride film with a thickness of 50 nm, and the insulating film 112b is a silicon nitride oxide film with a thickness of 50 nm, under a condition in which the source gas is hydrogen, the acceleration voltage is 40 kV, and the dose is $2.2 \times 10^{16}$ ions/cm², single crystal semiconductor layers with a thickness of about 120 nm can be peeled off from the single crystal semiconductor substrates 111. Alternatively, when hydrogen ions are added under a condition that is the same as above except for the insulating film 112a being a silicon oxynitride film with a thickness of 100 nm, single crystal semiconductor layers with a thickness of about 70 nm can be peeled off from the single crystal semiconductor substrates 111.

For the source gas of the ion beam 121, helium (He) can also be used. Since ion species generated by exciting helium are almost all $He^+$, even by an ion doping method that does not involve mass separation, $He^+$ can be added into the single crystal semiconductor substrate 111 as the main ions. Accordingly, microvoids can be formed efficiently in the damaged region 113 by an ion doping method. In the case of performing ion addition by an ion doping method using helium, the acceleration voltage can be 10 kV to 200 kV inclusive, and the dose can be $1 \times 10^{16}$ ions/cm² to $6 \times 10^{16}$ ions/cm² inclusive.

A halogen gas such as chlorine gas ($Cl_2$ gas) or fluorine gas ($F_2$ gas) can be used for the source gas.

Figure 7B:
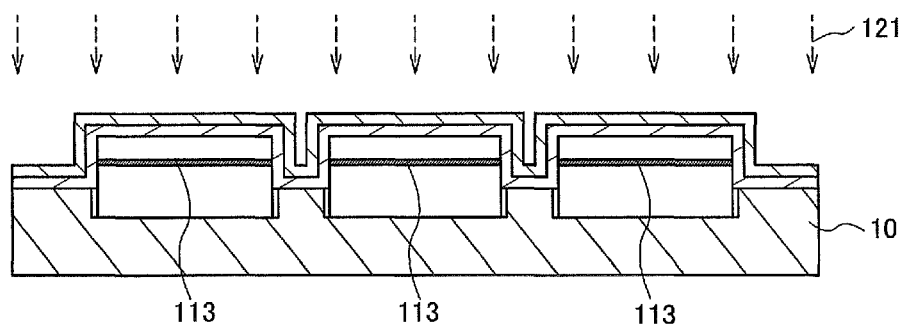
Figure 7C:
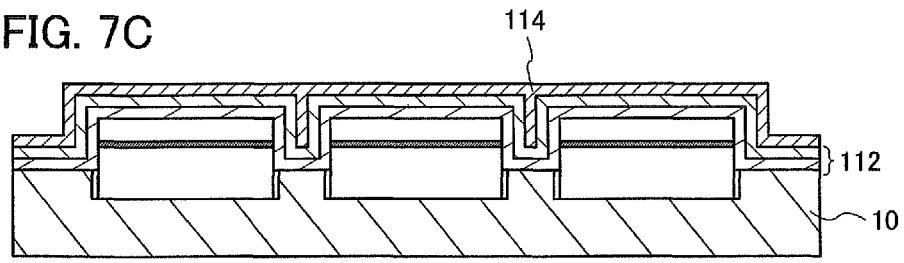

After forming the damaged regions 113, the bonding layer 114 is formed over a top surface of the insulating layer 112 as illustrated in FIG. 7C. In a step of forming the bonding layer 114, a heating temperature of the single crystal semiconductor substrate 111 is to be a temperature at which an element or a molecule added to the damaged region 113 does not separate out, and the heating temperature is preferably 350° C. or lower. In other words, this heating temperature is a temperature at which gas is not released from the damaged regions 113. Note that the bonding layer 114 can be formed before forming the damaged regions 113. In this case, a processing temperature for forming the bonding layer 114 can be 350° C. or higher.

The bonding layer 114 is a layer for forming a smooth and hydrophilic bonding plane on the surface of the single crystal semiconductor substrates 111. Therefore, the mean surface roughness Ra of the bonding layer 114 is equal to or less than 0.7 nm, and more preferably equal to or less than 0.4 nm. The thickness of the bonding layer 114 can be equal to or greater than 10 nm and equal to or less than 200 nm. The thickness is preferably equal to or greater than 5 nm and equal to or less than 500 nm, and more preferably equal to or greater than 10 nm and equal to or less than 200 nm.

The bonding layer 114 is preferably an insulating film formed by a chemical vapor reaction. For example, a silicon oxide film, a silicon oxynitride film, a silicon nitride oxide film, a silicon nitride film, or the like can be formed as the bonding layer 114. In the case of forming a silicon oxide film by a PECVD method as the bonding layer 114, an organosilane gas and an oxygen ($O_2$) gas are preferably used as a source gas. Usage of organosilane as a source gas enables formation of a silicon oxide film having a smooth surface at a process temperature of 350° C. or lower. Alternatively, the bonding layer 114 can be formed using a low temperature oxide (LTO) which is formed by a thermal CVD method at a heating temperature of 200° C. or higher and 500° C. or lower. For formation of the LTO, monosilane ($SiH_4$), disilane ($Si_2H_6$), or the like can be used as a silicon source gas, and dinitrogen monoxide ($N_2O$) or the like can be used as an oxygen source gas.

For example, the condition example for forming the bonding layer 114 of a silicon oxide film using TEOS and $O_2$ as a source gas is such that TEOS is introduced into a treatment chamber at a flow rate of 15 sccm and $O_2$ is introduced at a flow rate of 750 sccm. The film formation pressure can be 100 Pa, the film formation temperature can be 300° C., the high-frequency power output can be 300 W, and the power frequency can be 13.56 MHz.

The order of the step of FIG. 7B and the step of FIG. 7C can be reversed. In other words, after forming the insulating layer 112 and the bonding layer 114 on the plurality of single crystal semiconductor substrates 111 disposed on the tray 10, the damaged regions 113 can be formed. In this case, if the insulating layer 112 and the bonding layer 114 can be formed with the same film formation apparatus, it is preferable to sequentially form the insulating layer 112 and the bonding layer 114.

Further alternatively, after the step of FIG. 7B, the step of FIG. 7A and the step of FIG. 7C can be performed. In other words, after forming the damaged regions 113 by doping the plurality of single crystal semiconductor substrates 111 which are disposed on the tray 10 with ions, the insulating layer 112 and the bonding layer 114 can be formed. In this case, if the insulating layer 112 and the bonding layer 114 can be formed with the same film formation apparatus, it is preferable to sequentially form the insulating layer 112 and the bonding layer 114. Alternatively, in order to protect the surfaces of the single crystal semiconductor substrates 111, before forming the damaged regions 113, the single crystal semiconductor substrates 111 can be subjected to oxidation treatment to form an oxide film on the surfaces and the single crystal semiconductor substrates 111 can be doped with ion species through the oxide film. This oxide film is removed after formation of the damaged regions 113. Alternatively, the insulating layer 112 can be formed with this oxide film left behind.

Since the single crystal semiconductor substrates 111 are doped with ion species produced from a source gas by an ion doping method for forming the damaged regions 113, ion species other than the ion species of the source gas are included in the ion beam 121. Such other ion species are, for example, metal or the like which partly forms a tool or an electrode of a treatment chamber of the ion doping apparatus. Since the other ion species have larger mass than the ion species of the source gas (such as hydrogen or helium), the other ion species are introduced by doping to a surface of a film (the insulating layer 112, the bonding layer 114, or the oxide film) which is formed on the surfaces of the single crystal semiconductor substrates 111. In order to remove the impurities such as the metal, the surface of the film formed on the surfaces of the single crystal semiconductor substrates 111 can be thinly removed by wet etching after the ion doping step.

Figure 7D:
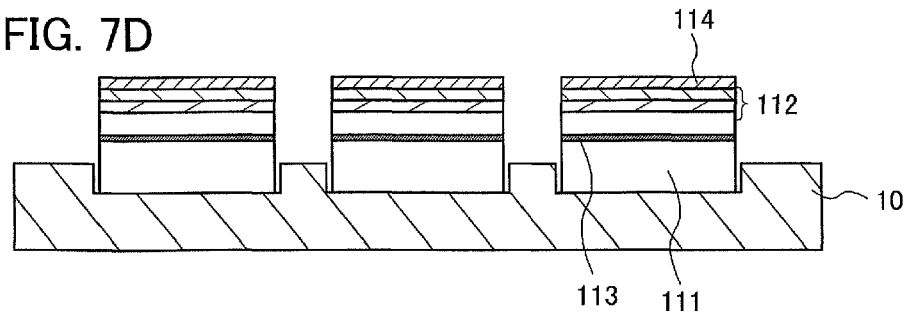

Next, the single crystal semiconductor substrates 111 each provided with the insulating layer 112, the damaged region 113, and the bonding layer 114 are detached from the tray 10, and the plurality of single crystal semiconductor substrates 111 are cleaned. This cleaning step can be performed by ultrasonic cleaning with pure water. As the ultrasonic cleaning, megahertz ultrasonic cleaning (megasonic cleaning) is preferable. After the ultrasonic cleaning, the single crystal semiconductor substrates 111 may be cleaned with ozone water. By cleaning with ozone water, an organic substance can be removed, and surface activation which improves a hydrophilic property of the surfaces of the bonding layers 114 can be performed. After the cleaning step and the surface activation treatment, the single crystal semiconductor substrates 111 are disposed in the depression portions 11 of the tray 10 as illustrated in FIG. 7D.

As the activation treatment of the surfaces of the bonding layers 114, irradiation treatment with an atomic beam or an ion beam, plasma treatment, or radical treatment can be performed as well as the cleaning with ozone water. When an atomic beam or an ion beam is used, an inert gas neutral atom beam or inert gas ion beam of argon or the like can be used. These treatments can also be performed with the single crystal semiconductor substrates 111 disposed on the tray 10.

Next, the single crystal semiconductor substrates 111 disposed on the tray 10 and the base substrate 101 are attached. Before attachment, the base substrate 101 is also cleaned. At that time, cleaning with hydrochloric acid and a hydrogen peroxide solution, or megahertz ultrasonic cleaning can be used. Similarly to the bonding layers 114, the surface to be a bonding plane of the base substrate 101 is preferably subjected to surface activation treatment.

Figure 8A:
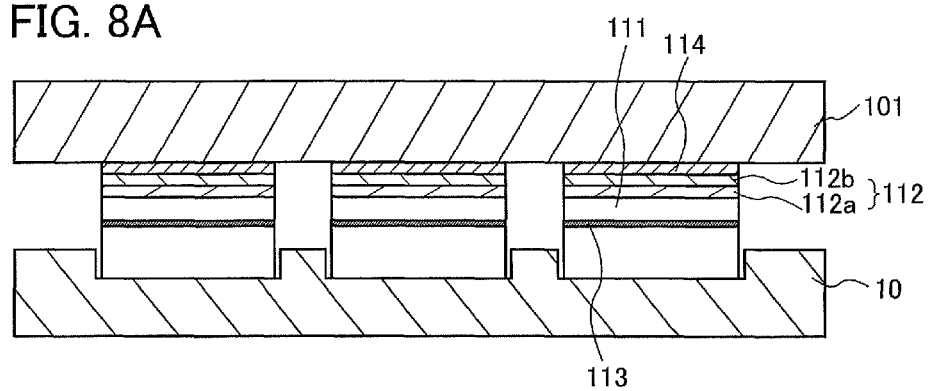
FIGS. 8A and 8B are cross-sectional views illustrating a manufacturing method of a substrate provided with semiconductor films.

FIG. 8A is a cross-sectional view illustrating a bonding step. The base substrate 101 is placed from above the tray 10 on which the plurality of single crystal semiconductor substrates 111 are disposed, and the base substrate 101 and the plurality of single crystal semiconductor substrates 111 are made to be in close contact with each other with the bonding layers 114 interposed therebetween. A pressure of about 300 N/cm² to 15000 N/cm² is applied to one part of the edge of the base substrate 101. This pressure is preferably 1000 N/cm² to 5000 N/cm². The bonding layers 114 and the base substrate 101 start bonding to each other from the pressurized part. Then, all the single crystal semiconductor substrates 111 on the tray 10 are bonded to one base substrate 101, so that the plurality of single crystal semiconductor substrates 111 can be closely in contact with the base substrate 101. This bonding step can be performed at room temperature without heat treatment; therefore, a substrate with such low heat resistance as to have an allowable temperature limit of 700° C. or lower like a glass substrate can be used as the base substrate 101.

Since the plurality of single crystal semiconductor substrates 111 are disposed on the tray 10, there is a case where a surface of the bonding layer 114 is not in contact with the base substrate 101 in one single crystal semiconductor substrate 111 due to difference in thickness between the single crystal semiconductor substrates 111. Therefore, it is preferable to apply pressure to not one part (one single crystal semiconductor substrate) but to each of the single crystal semiconductor substrates 111. Further, even in the case where there is variation in height of the surfaces of the bonding layers 114 while in the state of the single crystal semiconductor substrates 111 being disposed on the tray 10, if one part of the bonding layers 114 is closely in contact with the base substrate 101 due to deflection of the base substrate 101, bonding can proceed to the entire surface of the bonding layers 114.

Figure 9:
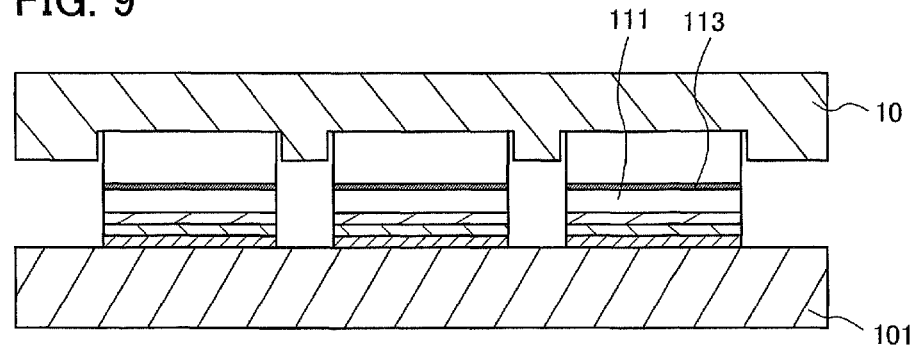
FIG. 9 is a cross-sectional view illustrating a manufacturing method of a substrate provided with semiconductor films.

After placing the base substrate 101 above the tray 10 as illustrated in FIG. 8A, the position of the base substrate 101 may be changed to the bottom as illustrated in FIG. 9. By turning the base substrate 101 and the tray 10 upside down, the difference in thickness between the single crystal semiconductor substrates 111 can be balanced out, so that the entire surfaces of the bonding layers 114 can be easily made to be in contact with the surface of the base substrate 101.

After bonding the single crystal semiconductor substrates 111 to the base substrate 101, it is preferable to perform heat treatment in order to increase bond force at a bonding interface between the base substrate 101 and the bonding layers 114. This treatment temperature is set at a temperature which does not cause a crack in the damaged regions 113 and can be in a temperature range of from 200° C. to 450° C. inclusive. Further, when the single crystal semiconductor substrates 111 are bonded to the base substrate 101 while heating at a temperature in the above-described range, bond force at the bonding interface between the base substrate 101 and the bonding layer 114 can be made strong.

When the base substrate 101 is placed above the single crystal semiconductor substrates 111 disposed on the tray 10 as illustrated in FIG. 8A, if the bonding plane is contaminated by dusts or the like, bonding does not occur in the contaminated part. Accordingly, in order to prevent contamination at the bonding plane, placement of the base substrate 101 is preferably conducted in an airtight treatment chamber. In addition, the treatment chamber preferably has a reduced pressure of about $5.0 \times 10^{-3}$ Pa, and the atmosphere at the bonding treatment is preferably kept clean.

Figure 8B:
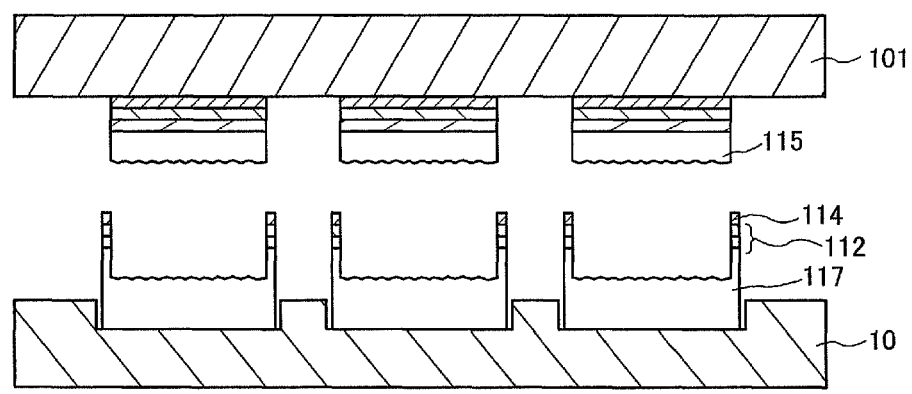

Next, heat treatment is performed to cause separation at the damaged regions 113, so that single crystal semiconductor layers 115 are separated from the single crystal semiconductor substrates 111. FIG. 8B illustrates a separation step of separating the single crystal semiconductor layers 115 from the single-crystalline semiconductor substrates 111. The elements denoted by reference numeral 117 are the single crystal semiconductor substrates 111 from which the single crystal semiconductor layers 115 are separated.

As illustrated in FIG. 8B, peripheral portions of the single crystal semiconductor substrates 111 are not bonded to the base substrate 101 in many cases. This is because the peripheral portions of the single crystal semiconductor substrates 111 are chamfered or the peripheral portions of the bonding layers 114 are damaged or soiled at the time of transferring the single crystal semiconductor substrates 111; accordingly, the base substrate 101 and the bonding layers 114 are not made to be closely in contact with each other in the peripheral portions. Another possible reason is that separation of the damaged regions 113 is not easily caused in the peripheral portions of the single crystal semiconductor substrates 111. Therefore, the single crystal semiconductor layers 115 having a smaller size than the single crystal semiconductor substrates 111 are bonded to the base substrate 101. In addition, projection portions are formed at the periphery of the single crystal semiconductor substrates 117, and portions of the insulating films 112b, the insulating films 112b, and the bonding layers 114 which are not bonded to the base substrate 101 are left on the projection portions.

When the heat treatment is performed, the element added by ion doping is separated out into microvoids which are formed in the damaged regions 113 by temperature increase, and the pressure in the microvoids is increased. By pressure increase, the volume of the microvoids in the damaged regions 113 is changed and a crack is generated in the damaged regions 113; accordingly, the single crystal semiconductor substrates 111 are separated along the damaged regions 113. Since the bonding layers 114 are bonded to the base substrate 101, the single crystal semiconductor layers 115 separated from the single crystal semiconductor substrates 111 are fixed over the base substrate 101. The temperature of the heat treatment for separating the single crystal semiconductor layers 115 from the single crystal semiconductor substrates 111 is set at a temperature which does not exceed a strain point of the base substrate 101.

This heat treatment can be performed with a rapid thermal annealing (RTA) apparatus, a resistance heating furnace, or a microwave heating apparatus. As the RTA apparatus, a gas rapid thermal annealing (GRTA) apparatus or a lamp rapid thermal annealing (LRTA) apparatus can be used. It is preferable that the temperature of the base substrate 101 to which the single crystal semiconductor layers 115 are bonded is increased to a temperature in the range of from 550° C. to 650° C. inclusive by this heat treatment.

In the case of using a GRTA apparatus, the heating temperature can be in the range of 550° C. to 650° C. inclusive, and the treatment time can be in the range of 0.5 minutes to 60 minutes inclusive. In the case of using a resistance heating furnace, the heating temperature can be in the range of 200° C. to 650° C. inclusive, and the treatment time can be in the range of 2 hours to 4 hours inclusive. In the case of using a microwave heating apparatus, for example, the treatment time can be in the range of 10 minutes to 20 minutes inclusive with a microwave having a frequency of 2.45 GHz.

A specific treatment method of heat treatment using a vertical furnace with resistance heating is described. The base substrate 101 (see FIG. 8A) to which the single crystal semiconductor substrates 111 disposed on the tray 10 are bonded is placed in a boat for the vertical furnace. This boat is carried into a chamber of the vertical furnace. First, the chamber is exhausted to have a vacuum state in order to suppress oxidation of the single crystal semiconductor substrates 111. The degree of vacuum is approximately $5 \times 10^{-3}$ Pa. After making the vacuum state, nitrogen is supplied to the chamber so that the chamber has a nitrogen atmosphere that is under atmospheric pressure. During this, the temperature is increased to 200° C.

After making the chamber have a nitrogen atmosphere that is under atmospheric pressure, heating at 200° C. is performed for 2 hours. Then, the temperature is increased to 400° C. in one hour. After the state at a heating temperature of 400° C. stabilizes, the temperature is increased to 600° C. in one hour. After the state at a heating temperature of 600° C. stabilizes, heat treatment at 600° C. is performed for 2 hours.

Then, the temperature is decreased to 400° C. in one hour, and after 10 minutes to 30 minutes, the boat is carried out of the chamber. The single crystal semiconductor substrates 117 disposed on the tray 10 and the base substrate 101 to which the single crystal semiconductor layers 115 are bonded that are in the boat are cooled in air atmosphere.

As the heat treatment using the above-described resistance heating furnace, heat treatment for increasing the bond force between the bonding layers 114 and the base substrate 101 and heat treatment for causing separation at the damaged regions 113 are sequentially performed. In the case where these two heat treatments are performed with different apparatuses, for example, heat treatment at a treatment temperature of 200° C. is performed for a treatment time of 2 hours in a resistance heating furnace, and the base substrate 101 and the single crystal semiconductor substrates 111, which are bonded to each other, are carried out from the furnace. Then, heat treatment at a treatment temperature of 600° C. to 700° C. inclusive is performed for a treatment time of 1 minute to 30 minutes inclusive with an RTA apparatus, so that the single crystal semiconductor substrates 111 are separated at the damaged regions 113.

In order that the bonding layers 114 and the base substrate 101 are firmly bonded to each other by treatment with such a low temperature of 700° C. or lower, it is preferable that an OH group or a water molecule ($H_2O$) exist on the surfaces of the bonding layers 114 or the surface of the base substrate. This is because the bonding layers 114 and the base substrate 101 start bonding to each other by formation of a covalent bond (covalent bond between an oxygen molecule and a hydrogen molecule) or a hydrogen bond by the OH group or the water molecule.

Accordingly, the surfaces of the bonding layers 114 and the base substrate 101 are preferably activated to be hydrophilic. Further, the bonding layers 114 are preferably formed by such a method as to contain oxygen or hydrogen. For example, when a silicon oxide film, a silicon oxynitride film, a silicon nitride oxide film, a silicon nitride film, or the like is formed by a PECVD method at a treatment temperature of 400° C. or lower, the film can contain hydrogen. For formation of the silicon oxide film or the silicon oxynitride film, $SiH_4$ and $N_2O$ may be used, for example, as a process gas. For formation of the silicon nitride oxide film, $SiH_4$, $NH_3$, and $N_2O$ may be used, for example. For formation of the silicon nitride film, $SiH_4$ and $NH_3$ may be used, for example. Further, it is also preferable to use a compound including an OH group such as TEOS (chemical formula: $Si(OC_2H_5)_4$) as a source material in formation by a PECVD method.

Here, treatment at a heating temperature of 700° C. or lower is referred to as low-temperature treatment because the treatment is performed at a temperature equal to or lower than an allowable temperature limit of a glass substrate. In addition, in contrast to this embodiment mode, in forming an SOI substrate by Smart Cut (registered trademark), heat treatment at 800° C. or higher is performed in order to bond a single crystal silicon layer and a single crystal silicon wafer, and heat treatment at a temperature higher than the allowable temperature limit of a glass substrate is required. Accordingly, treatment at a temperature of 700° C. or lower is referred to as low-temperature treatment.

When a substrate which greatly shrinks by heat is used as the base substrate 101, thermal shrinkage due to temperature increase is, in some cases, a problem in a manufacturing process of the semiconductor substrate 100 and a manufacturing process of a semiconductor device which uses the semiconductor substrate 100. In such a case, the influence of the problem can be suppressed by heating the base substrate 101 before bonding the single crystal semiconductor substrates 111 so as to cause thermal shrinkage in advance. This heat treatment can be, for example, performed in such a manner that heating at 640° C. is conducted for 4 hours in a resistance heating furnace and then cooling at a rate of 0.2° C./minute is conducted. Alternatively, the heat treatment can be performed with a GRTA apparatus in such a manner that heating at 650° C. for 6 minutes is repeated three to five times. Note that if the base substrate 101 can thermally shrink by heat treatment of FIG. 8B for separating the single crystal semiconductor substrates 111, it is not necessary to perform the heat treatment before bonding.

Figure 10A:
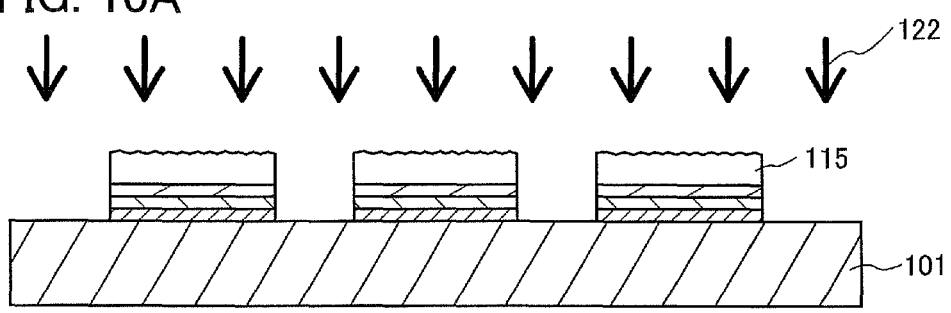
FIGS. 10A and 10B are cross-sectional views illustrating a manufacturing method of a substrate provided with semiconductor films.

Here, crystal defects are formed in the single crystal semiconductor layers 115, which are closely in contact with the base substrate 101, due to separation at the damaged regions 113 and formation of the damaged regions 113. In addition, the planarity of surfaces of the single crystal semiconductor layers 115 is deteriorated. For reduction of the crystal defects and improvement in planarity of the surfaces, the single crystal semiconductor layers 115 are irradiated with a laser beam 122 as illustrated in FIG. 10A.

Figure 10B:
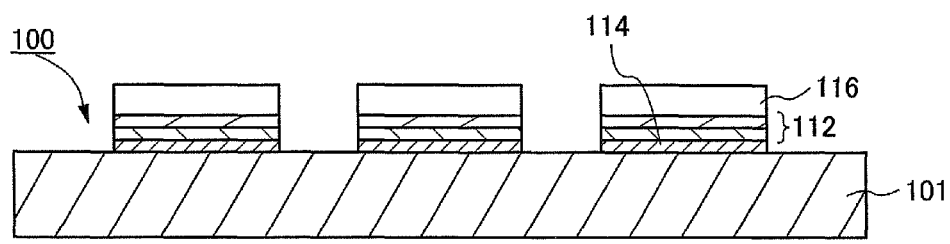

By irradiation with the laser beam 122 from the single crystal semiconductor layers 115 side, the single crystal semiconductor layers 115 are melted from their upper surfaces. After melting, the single crystal semiconductor layers 115 are cooled and solidified; accordingly, single crystal semiconductor layers 116 having upper surfaces with improved planarity are formed as illustrated in FIG. 10B. The external view of FIG. 10B is FIG. 1.

In this laser beam irradiation step, since temperature increase of the base substrate 101 is suppressed by using the laser beam 122, a substrate having low heat resistance like a glass substrate can be used as the base substrate 101. It is preferable that the single crystal semiconductor layers 115 be partially melted by irradiation with the laser beam 122. If the single crystal semiconductor layers 115 are completely melted, recrystallization of the single crystal semiconductor layers 115 is accompanied with disordered nucleation of the single crystal semiconductor layers 115 in a liquid phase and crystallinity of the single crystal semiconductor layers 115 is lowered. By partial melting, so-called longitudinal growth in which crystal growth proceeds from a solid portion which is not melted occurs in the single crystal semiconductor layers 115. Due to recrystallization by the longitudinal growth, crystal defects of the single crystal semiconductor layers 115 are decreased and crystallinity thereof is recovered. Note that the state where the single crystal semiconductor layers 115 are completely melted indicates, in the case of the stack structure of FIG. 10A, that the portion from the upper surface of the single crystal semiconductor layers 115 to the interface with the bonding layers 114 is melted and is in a liquid phase. On the other hand, the state where the single crystal semiconductor layers 115 are partially melted indicates that the upper layer thereof is melted and is in a liquid phase and a lower layer thereof is in a solid phase.

As a laser apparatus of the laser beam 122, a laser apparatus capable of oscillating a laser beam having an oscillation wavelength of from an ultraviolet region to a visible light region is selected. The laser beam 122 has such a wavelength as to be absorbed by the single crystal semiconductor layers 115. The wavelength can be determined in consideration of the skin depth of the laser beam or the like. For example, the wavelength can be in the range of from 250 nm to 700 nm inclusive.

The laser apparatus can be a continuous wave laser, a pseudo continuous wave laser, or a pulsed laser. A pulsed laser is preferable for partial melting. For example, in the case of a pulsed laser, the repetition rate is equal to or more than 1 MHz and the pulse width is equal to or more than 10 nanoseconds and equal to or less than 500 nanoseconds. For example, a XeCl excimer laser with a repetition rate of 10 Hz to 300 Hz, a pulse width of 25 nanoseconds, and a wavelength of 308 nm can be used.

In addition, the energy of the laser beam 122 can be determined in consideration of the wavelength of the laser beam 122, the skin depth of the laser beam 122, the thickness of the single crystal semiconductor substrates 111, and the like. The energy of the laser beam 122 can be, for example, in the range of 300 mJ/cm$^2$ to 800 mJ/cm$^2$ inclusive. For example, in the case where the thickness of the single crystal semiconductor layers 115 is approximately 120 nm, a pulsed laser is used as the laser apparatus, and the wavelength of the laser beam 122 is 308 nm, the energy density of the laser beam 122 can be 600 mJ/cm$^2$ to 700 mJ/cm$^2$.

Irradiation with the laser beam 122 is preferably performed in an inert atmosphere such as a rare gas atmosphere or a nitrogen atmosphere or in a vacuum state. In order to perform irradiation with the laser beam 122 in an inert atmosphere, irradiation with the laser beam 122 may be performed in an airtight chamber while the atmosphere in the chamber is controlled. In the case where the chamber is not used, by blowing an inert gas such as a nitrogen gas or a rare gas to the surface irradiated with the laser beam 122, irradiation with the laser beam 122 in an inert atmosphere can be realized.

The inert atmosphere such as nitrogen and a vacuum state have higher effect of improving planarity of the single crystal semiconductor layers 116 than the air atmosphere. In addition, since the inert atmosphere and the vacuum state have higher effect of suppressing generation of cracks and ridges than the air atmosphere, the applicable energy range for the laser beam 122 is widened.

By an optical system, the energy distribution of the laser beam 122 is preferably homogenized and the cross section of the laser beam 122 is preferably made to be linear. Thus, homogeneous irradiation with the laser beam 122 can be performed in high throughput. When the beam length of the laser beam 122 is longer than one side of the base substrate 101, all the single crystal semiconductor layers 115 bonded to the base substrate 101 can be irradiated with the laser beam 122 by scanning once. When the beam length of the laser beam 122 is shorter than one side of the base substrate 101, all the single crystal semiconductor layers 115 bonded to the base substrate 101 can be irradiated with the laser beam 122 by scanning several times.

Note that before irradiating the single crystal semiconductor layers 115 with the laser beam 122, treatment for removing an oxide film such as a natural oxide film formed on the surfaces of the single crystal semiconductor layers 115 is performed. The oxide film is removed because even if irradiation with the laser beam 122 is performed in the state that the oxide film remains on the surfaces of the single crystal semiconductor layers 115, the surfaces of the single crystal semiconductor layers 115 are not planarized sufficiently. The treatment for removing the oxide film can be performed by processing the single crystal semiconductor layers 115 with a hydrofluoric acid solution. The treatment with hydrofluoric acid is desirably performed until the surfaces of the single crystal semiconductor layers 115 exhibit a hydrophilic property. By exhibition of the hydrophilic property, removal of the oxide film from the single crystal semiconductor layers 115 can be confirmed.

The irradiation step with the laser beam 122 illustrated in FIG. 10A can be performed in the following manner. First, the single crystal semiconductor layers 115 are processed with a hydrofluoric acid solution diluted at a rate of 1:100 (=hydrofluoric acid: water) for 110 seconds so that the oxide film on the surfaces is removed. As the laser apparatus of the laser beam 122, a XeCl excimer laser (wavelength: 308 nm, pulse width: 25 nanoseconds, repetition rate: 60 Hz) is used. By an optical system, the laser beam 122 is shaped into a linear shape with a cross section of 300 mm×0.34 mm. The single crystal semiconductor layers 115 are irradiated with the laser beam 122 with a scanning speed of the laser beam 122 of 2.0 mm/second, a scanning pitch of 33 μm, and a shot number of about 10. Scanning with the laser beam 122 is performed while blowing a nitrogen gas to the irradiation surface. Since the beam length of the laser beam 122 is 300 mm, in the case where the base substrate 101 has a size of 730 mm×920 mm, the irradiation region of the laser beam 122 is divided into three regions. In this manner, all the single crystal semiconductor layers 115 bonded to the base substrate 101 can be irradiated with the laser beam 122.

The surfaces of the single crystal semiconductor layers 116, which are irradiated with the laser beam 122, are planarized, and the mean surface roughness of the irregularities of the surfaces can be equal to or more than 1 nm and equal to or less than 7 nm. In addition, the root-mean-square roughness of the irregularities can be equal to or more than 1 nm and equal to or less than 10 nm. Further, the maximum peak-to-valley height of the irregularities can be equal to or more than 5 nm and equal to or less than 250 nm. That is, the irradiation treatment with the laser beam 122 can be regarded as planarization treatment of the single crystal semiconductor layers 115.

When the single crystal semiconductor layers 116 each having a planar surface are formed, the thickness of a gate insulating film formed over the single crystal semiconductor layers 116 can be as thin as about 5 nm to 50 nm inclusive. Accordingly, a transistor having high ON current at the same time as having a suppressed gate voltage can be formed.

Although chemical mechanical polishing (abbr. CMP) is known as the planarization treatment, in the case of using a mother glass substrate as the base substrate 101, it is difficult to perform planarization treatment on the single crystal semiconductor layers 115 by CMP because the mother glass substrate has a large area and distortion. Since irradiation treatment with the laser beam 122 is performed as the planarization treatment in this embodiment mode, the single crystal semiconductor layers 115 can be planarized without using a way of applying force which would break the mother glass substrate or a way of heating the mother glass substrate at a temperature exceeding an allowable temperature limit thereof.

After irradiation with the laser beam 122, the single crystal semiconductor layers 116 are preferably subjected to heat treatment at a temperature of equal to or higher than 500° C. and equal to or lower than 650° C. By this heat treatment, defects in the single crystal semiconductor layers 116, which have not been recovered by the irradiation with the laser beam 122, can be eliminated and distortion of the single crystal semiconductor layers 116, which also have not been recovered by the irradiation with the laser beam 122, can be alleviated. For the heat treatment, a rapid thermal annealing (RTA) apparatus, a resistance heating furnace, or a microwave heating apparatus can be used. As the RTA apparatus, a gas rapid thermal annealing (GRTA) apparatus or a lamp rapid thermal annealing (LRTA) apparatus can be used. In the case of using a resistance heating furnace, heating at a temperature of 500° C. may be performed for 1 hour and then heating at 550° C. may be performed for 4 hours.

Through the above-described process, the semiconductor substrate 100 illustrated in FIG. 1 and FIG. 10B can be manufactured. In this embodiment mode, the insulating layers 112, the damaged regions 113, and the bonding layers 114 are formed, with the plurality of single crystal semiconductor substrates 111 placed on the tray 10. Therefore, the plurality of single crystal semiconductor substrates 111 can be processed collectively; accordingly, the semiconductor substrate 100 can be formed in high throughput. Note that formation of the insulating layers 112, the damaged regions 113, and the bonding layers 114 can also be performed without placing the single crystal semiconductor substrates 111 on the tray 10.

Since the base substrate 101 is bonded to the single crystal semiconductor substrates 111, with the single crystal semiconductor substrates 111 disposed on the tray 10, the plurality of single crystal semiconductor substrates 111 can be easily bonded to desired positions of the base substrate 101 in high throughput.

Since the steps from FIG. 7A up to and including FIG. 10B can be performed at temperatures of equal to or lower than 700° C., a glass substrate having an allowable temperature limit of 700° C. or lower can be used as the base substrate 101. Since an inexpensive glass substrate can be used, the material cost of the semiconductor substrate 100 can be reduced. Furthermore, since a large-sized substrate like a mother glass substrate (500 mm×500 mm or larger, preferably 600 mm×700 mm or larger, and more preferably 700 mm×900 mm or larger) can be used as the base substrate, a large-sized substrate having semiconductor films in which single crystal semiconductor layers are included can be provided.

The steps from FIG. 7A up to and including FIG. 7C are performed without moving the single crystal semiconductor substrates 111 to another tray 10; however, in each step, the single crystal semiconductor substrates 111 may be placed on a special tray 10 for an apparatus used in the step. For example, the tray 10 special for a PECVD apparatus may be used in formation step of the insulating layer 112, and the tray 10 special for a doping apparatus may be used in the step of FIG. 7C.

Alternatively, after the formation step of the insulating layer 112 of FIG. 7A, the single crystal semiconductor substrates 111 on which the insulating layer 112 is formed can be separated from the tray 10, and cleaning treatment such as ultrasonic cleaning can be performed on the single crystal semiconductor substrates 111. After the cleaning treatment, the single crystal semiconductor substrates 111 can be disposed on a different clean tray 10 as well.

Further alternatively, after the formation step of the damaged regions 113 of FIG. 7B, the single crystal semiconductor substrates 111 in each of which the damaged region 113 is formed can be removed from the tray 10, and cleaning treatment such as ultrasonic cleaning can be performed on the single crystal semiconductor substrates 111. After the cleaning treatment, the single crystal semiconductor substrates 111 can be disposed on a different clean tray 10.

Embodiment Mode 2

In Embodiment Mode 2, reprocessing treatment of a single crystal semiconductor substrate will be described. Here, a method of reprocessing the single crystal semiconductor substrate 117 illustrated in FIG. 8B, from which the single crystal semiconductor layer 115 is separated, will be described with reference to FIGS. 11A to 11D.

Figure 11A:
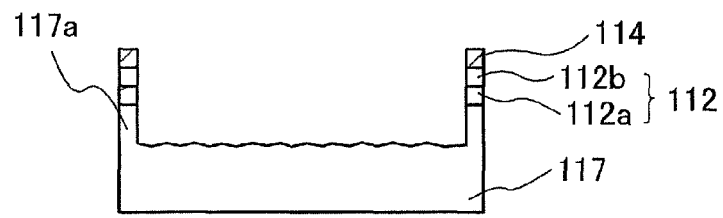
FIGS. 11A to 11D are diagrams describing reprocessing treatment of a single crystal semiconductor substrate.

After the step of FIG. 8B, as illustrated in FIG. 11A, a projection portion 117a is formed at the periphery of the single crystal semiconductor substrate 117, and portion of the insulating film 112b, the insulating film 112a, and the bonding layer 114, which is not bonded to the base substrate 101, is left over the projection portion 117a.

Figure 11B:
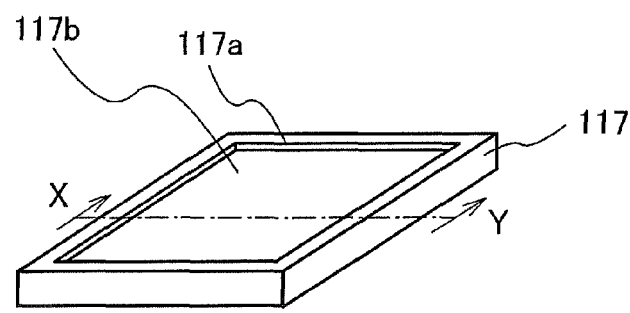
Figure 11C:
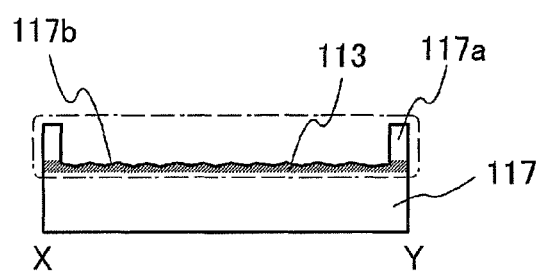

First, etching treatment for removing the insulating film 112b, the insulating film 112a, and the bonding layer 114 is performed. In the case where these films are formed using silicon oxide, silicon oxynitride, or silicon nitride oxide, wet etching treatment using a hydrofluoric acid solution is performed. By this etching treatment, the single crystal semiconductor substrate 117 is obtained as illustrated in FIG. 11B. FIG. 11C is a cross-sectional view taken along a chain line X-Y of FIG. 11B.

Next, the single crystal semiconductor substrate 117 illustrated in FIG. 11B and FIG. 11C is subjected to etching treatment, so that the projection portion 117a and a separation surface 117b, from which the single crystal semiconductor layer 115 is separated, are removed. The portion surrounded by a chain line in FIG. 11C indicates a region that should be removed by this etching treatment. By this etching, a region which remains on the single crystal semiconductor substrate 117 and contains hydrogen excessively like the damaged region 113 is removed. As the etching treatment for the single crystal semiconductor substrate 117, wet etching treatment is preferable, and as an etchant, a tetramethylammonium hydroxide (abbr. TMAH) solution can be used.

Figure 11D:
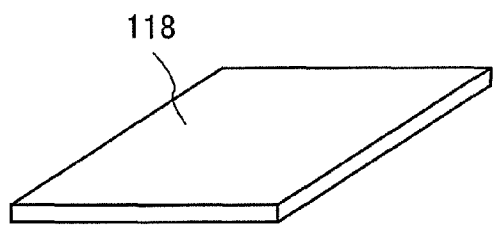

After removing the projection portion 117a, the separation surface 117b, and the damaged region 113 illustrated in FIG. 11C by etching the single crystal semiconductor substrate 117, the surface is polished; accordingly, a single crystal semiconductor substrate 118 having a smooth surface as illustrated in FIG. 11D is formed. This single crystal semiconductor substrate 118 can be reused as the single crystal semiconductor substrate 111 illustrated in FIG. 2.

As polishing treatment, chemical mechanical polishing (abbr. CMP) can be used. In order to make the single crystal semiconductor substrate 118 have a smooth surface, polishing of about 1 μm to 10 μm is desirably performed. After polishing, since polishing particles and the like remain on the surface of the single crystal semiconductor substrate 118, cleaning with hydrofluoric acid or RCA cleaning is performed.

By reusing the single crystal semiconductor substrate 118, the material cost of the semiconductor substrate 100 can be reduced.

Embodiment Mode 3

As an example of a manufacturing method of a semiconductor device which uses the semiconductor substrate 100, a manufacturing method of thin film transistors (TFTs) will be described in Embodiment Mode 3, with reference to FIGS. 12A to 12D, FIGS. 13A to 13C, and FIG. 14. By combining a plurality of thin film transistors, various semiconductor devices are manufactured. In this embodiment mode, the semiconductor substrate 100 manufactured by the manufacturing method of Embodiment Mode 1 is used.

Figure 12A:
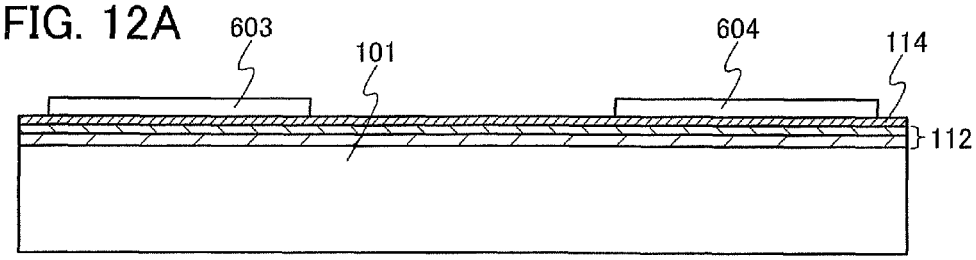
FIGS. 12A to 12D are cross-sectional views describing a manufacturing method of a semiconductor device.

As illustrated in FIG. 12A, the single crystal semiconductor layers 116 over the base substrate 101 are processed (patterned) to have a desired shape by etching, so that a semiconductor film 603 and a semiconductor film 604 are formed. A p-channel transistor is formed using the semiconductor film 603, and an n-channel transistor is formed using the semiconductor film 604.

To control threshold voltages, a p-type impurity element such as boron, aluminum, or gallium or an n-type impurity element such as phosphorus or arsenic may be added to the semiconductor film 603 and the semiconductor film 604. For example, in the case of adding boron as an impurity element imparting p-type conductivity, boron may be added at a concentration of greater than or equal to $5\times10^{16}$ cm$^{-3}$ and less than or equal to $1\times10^{17}$ cm$^{-3}$. The addition of the impurity element for controlling the threshold voltages may be performed on the single crystal semiconductor layers 116 or on the semiconductor film 603 and the semiconductor film 604. Alternatively, the addition of the impurity element for controlling the threshold voltages may be performed on the single crystal semiconductor substrates 111. Further alternatively, the addition of the impurity element may be performed on the single crystal semiconductor substrates 111 for roughly adjusting the threshold voltages, and then the addition of the impurity element may be further performed on the single crystal semiconductor layers 116 or on the semiconductor film 603 and the semiconductor film 604 for finely adjusting the threshold voltages.

Taking as an example the case of using weak p-type single crystal silicon substrates as the single crystal semiconductor substrates 111, an example of a method for adding such an impurity element is described. First, before etching the single crystal semiconductor layers 116, boron is added to the entire single crystal semiconductor layers 116. This addition of boron aims at adjusting the threshold voltage of a p-channel transistor. Using $B_2H_6$ as a dopant gas, boron is added at a concentration of $1\times10^{16}$/cm$^3$ to $1\times10^{17}$/cm$^3$. The concentration of boron is determined in consideration of the activation rate or the like. For example, the concentration of boron can be $6\times10^{16}$/cm$^3$. Next, the single crystal semiconductor layers 116 are etched to form the semiconductor film 603 and the semiconductor film 604. Then, boron is added to only the semiconductor film 604. The second addition of boron aims at adjusting the threshold voltage of an n-channel transistor. Using $B_2H_6$ as a dopant gas, boron is added at a concentration of $1\times10^{16}$/cm$^3$ to $1\times10^{17}$/cm$^3$. For example, the concentration of boron can be $6\times10^{16}$/cm$^3$.

Note that in the case where a substrate having a conductivity type or resistance suitable for the threshold voltage of either of the p-channel transistor or the n-channel transistor can be used as the single crystal semiconductor substrates 111, the required number of steps for adding an impurity element for controlling the threshold voltage can be one; at that time, an impurity element for controlling the threshold voltage may be added to one of the semiconductor film 603 and the semiconductor film 604.

Figure 12B:
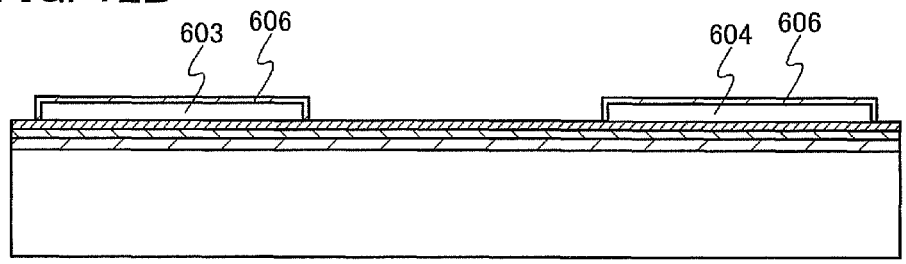

As illustrated in FIG. 12B, gate insulating films 606 are formed to cover the semiconductor film 603 and the semiconductor film 604. The gate insulating films 606 can be formed by oxidizing or nitriding surfaces of the semiconductor film 603 and the semiconductor film 604 by high-density plasma treatment. The high-density plasma treatment is performed using, for example, a mixed gas of a rare gas such as He, Ar, Kr, or Xe and oxygen, nitrogen oxide, ammonia, nitrogen, hydrogen, or the like. In this case, when excitation of the plasma is performed by introduction of a microwave, high density plasma with a low electron temperature can be generated. The surfaces of the semiconductor films are oxidized or nitrided by oxygen radicals (OH radicals may be included) or nitrogen radicals (NH radicals may be included) which are generated by such high-density plasma, whereby insulating films are formed to a thickness of 1 nm to 20 nm, desirably 5 nm to 10 nm so as to be in contact with the semiconductor films. The insulating films with a thickness of 5 nm to 10 nm are used as the gate insulating films 606.

Since the oxidation or nitridation of the semiconductor films by the high-density plasma treatment is a solid-phase reaction, the interface state density between the gate insulating films 606 and each of the semiconductor film 603 and the semiconductor film 604 can be drastically reduced. In addition, the semiconductor films are directly oxidized or nirtided by the high-density plasma treatment, so that variation in thickness of the insulating films to be formed can be suppressed. In the case where the semiconductor films have crystallinity, by oxidizing the surfaces of the semiconductor films under a solid-phase reaction by the high-density plasma treatment, rapid oxidation only in a crystal grain boundary can be prevented; thus, gate insulating films with good uniformity and low interface state density can be formed. For these reasons, a transistor whose gate insulating film partially or wholly includes an insulating film formed by high-density plasma treatment can have suppressed variation in characteristics.

Alternatively, the gate insulating films 606 may be formed by thermally oxidizing the semiconductor film 603 and the semiconductor film 604. Further alternatively, the gate insulating films 606 may be formed as a single layer or a stack of plural layers of a film including silicon oxide, silicon nitride oxide, silicon nitride, hafnium oxide, aluminum oxide, or tantalum oxide by a PECVD method, a sputtering method, or the like.

After formation of the gate insulating films 606 containing hydrogen, heat treatment may be performed at a temperature equal to or higher than 350° C. and equal to or lower than 450° C., so that hydrogen contained in the gate insulating films 606 may be diffused into the semiconductor film 603 and the semiconductor film 604. In this case, the gate insulating films 606 can be formed by stacking silicon nitride or silicon nitride oxide by a PECVD method at a process temperature of equal to or lower than 350° C. By supplying hydrogen to the semiconductor film 603 and the semiconductor film 604, defects which may function as trapping centers in the semiconductor film 603 and the semiconductor film 604 or at an interface between the gate insulating films 606 and the semiconductor films 603 and 604 can be effectively reduced.

Figure 12C:
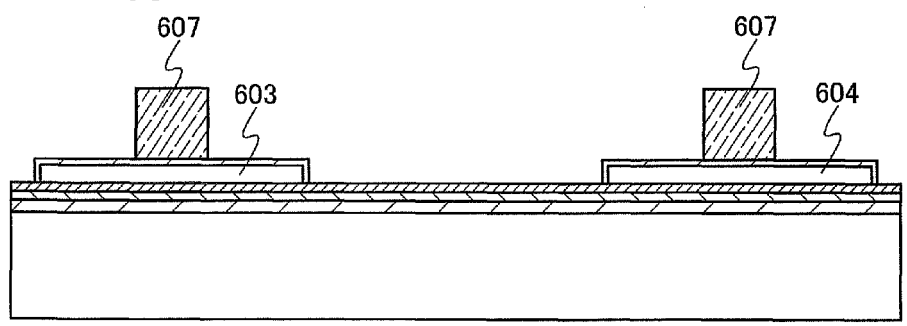

Then, after forming a conductive film over the gate insulating films 606 as illustrated in FIG. 12C, the conductive film is processed (patterned) into a predetermined shape, thereby forming an electrode 607 over each of the semiconductor film 603 and the semiconductor film 604. The conductive film can be formed by a CVD method, a sputtering method, or the like. For the conductive film, tantalum (Ta), tungsten (W), titanium (Ti), molybdenum (Mo), aluminum (Al), copper (Cu), chromium (Cr), niobium (Nb), or the like may be used. Alternatively, an alloy containing the above-described metal as a main component or a compound containing the above-described metal can also be used. Further alternatively, the conductive film may be formed using a semiconductor such as polycrystalline silicon which is formed by addition of an impurity element imparting a conductivity type, such as phosphorus, to a semiconductor film.

As a combination of two conductive films, tantalum nitride or tantalum (Ta) can be used for a first layer, and tungsten (W) can be used for a second layer. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two conductive films are formed. Alternatively, as a combination of the two conductive films, for example, silicon doped with an impurity imparting n-type conductivity and nickel silicide, Si doped with an impurity imparting n-type conductivity and WSix, or the like can be used.

In addition, although each of the electrodes 607 is formed of a single-layer conductive film in this embodiment mode, this embodiment mode is not limited to this structure. The electrodes 607 may be formed by stacking plural conductive films. In the case of a three-layer structure in which three or more conductive films are stacked, a stacked-layer structure of a molybdenum film, an aluminum film, and a molybdenum film may be employed.

As masks used for forming the electrodes 607, instead of resist, silicon oxide, silicon nitride oxide, or the like may be used. Although, in this case, a step of etching silicon oxide, silicon nitride oxide, or the like is added, the reduction in film thickness and width of the masks at the time of etching is less than that in the case of using a resist mask; accordingly, the electrodes 607 each having a desired width can be formed. Alternatively, the electrodes 607 may be formed selectively by a droplet discharge method without using the masks.

Note that a droplet discharge method means a method in which droplets containing a predetermined composition are discharged or ejected from fine pores to form a predetermined pattern, and includes an ink-jet method and the like.

After forming the conductive film, the conductive film is etched by an inductively coupled plasma (ICP) etching method to form the electrodes 607. The conductive film can be etched into a desired tapered shape by appropriately controlling the etching condition (e.g., the amount of electric power applied to a coiled electrode layer, the amount of electric power applied to an electrode layer on the substrate side, or the electrode temperature on the substrate side). Further, angles and the like of the taper shapes can also be controlled by the shape of the masks. Note that as an etching gas, a chlorine-based gas such as chlorine, boron chloride, silicon chloride or carbon tetrachloride; a fluorine-based gas such as carbon tetrafluoride, sulfur fluoride, or nitrogen fluoride; or oxygen can be used as appropriate.

Figure 12D:
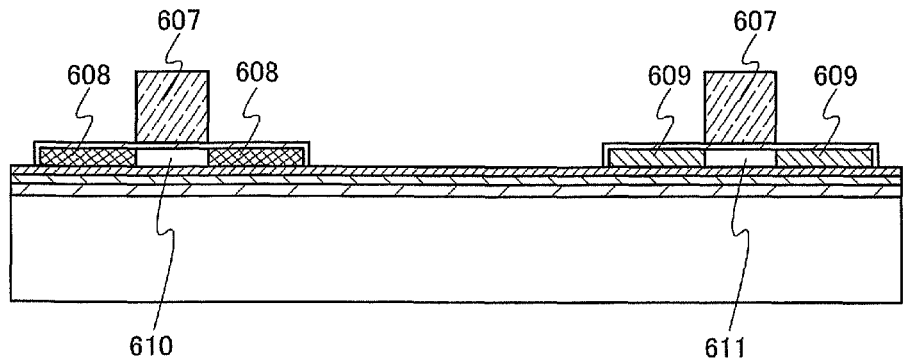

Next, as illustrated in FIG. 12D, an impurity element imparting one conductivity type is added to the semiconductor film 603 and the semiconductor film 604 with the use of the electrodes 607 as masks. In this embodiment mode, an impurity element imparting p-type conductivity (e.g., boron) is added to the semiconductor film 603, and an impurity element imparting n-type conductivity (e.g., phosphorus or arsenic) is added to the semiconductor film 604. In this step, impurity regions to be a source region and a drain region are formed in the semiconductor film 603, and impurity regions serving as high-resistant regions are formed in the semiconductor film 604.

Note that when the impurity element imparting p-type conductivity is added to the semiconductor film 603, the semiconductor film 604 is covered with a mask or the like so that the impurity element imparting p-type conductivity is not added to the semiconductor film 604. On the other hand, when the impurity element imparting n-type conductivity is added to the semiconductor film 604, the semiconductor film 603 is covered with a mask or the like so that the impurity element imparting n-type conductivity is not added to the semiconductor film 603. Alternatively, after adding an impurity element imparting one of p-type and n-type conductivity to the semiconductor film 603 and the semiconductor film 604, an impurity element imparting the other conductivity may be added to one of the semiconductor film 603 and the semiconductor film 604 selectively at higher concentration than the previously added impurity element. By this adding step of impurity element, p-type high-concentration impurity regions 608 are formed in the semiconductor film 603, and n-type low-concentration impurity regions 609 are formed in the semiconductor film 604. The regions overlapped with the electrodes 607 in the semiconductor film 603 and the semiconductor film 604 are a channel formation region 610 and a channel formation region 611.

Figure 13A:
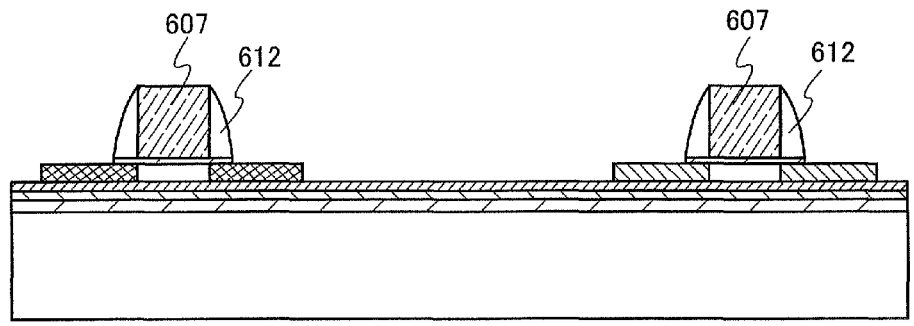
FIGS. 13A to 13C are cross-sectional views describing a manufacturing method of a semiconductor device.

Next, as illustrated in FIG. 13A, sidewalls 612 are formed on side surfaces of the electrodes 607. For example, the sidewalls 612 can be formed in such a manner that an insulating film is newly formed so as to cover the gate insulating films 606 and the electrodes 607, and the newly-formed insulating film is partially etched by anisotropic etching in which etching is performed mainly in a perpendicular direction. The newly-formed insulating film is partially etched by the above-described anisotropic etching, whereby the sidewalls 612 are formed on the side surfaces of the electrodes 607. Note that the gate insulating films 606 are also partially etched by this anisotropic etching. The insulating film for forming the sidewalls 612 can be formed as a single layer or a stack of two or more layers of a film including an organic material such as an organic resin or a film of silicon, silicon oxide, or silicon nitride oxide by a PECVD method, a sputtering method, or the like. In this embodiment mode, the insulating film is formed of a silicon oxide film with a thickness of 100 nm by a PECVD method. In addition, as an etching gas of the silicon oxide film, a mixed gas of $CHF_3$ and helium can be used. It is to be noted that the steps for formation of the sidewalls 612 are not limited to the steps given here.

Figure 13B:
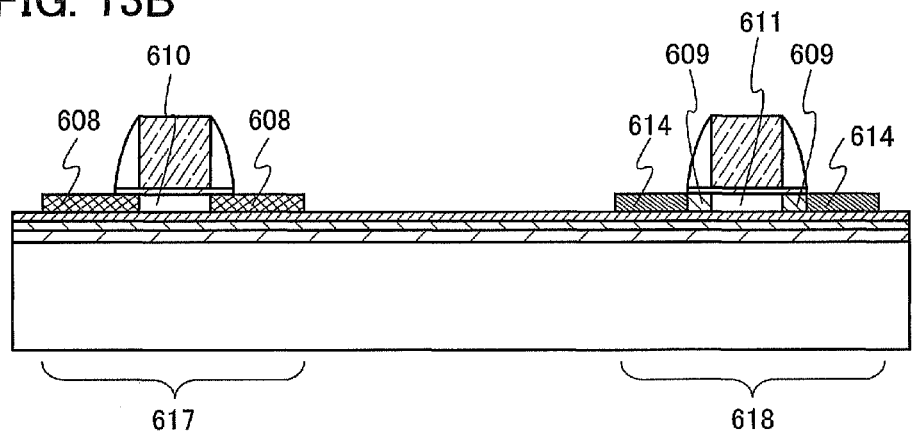

As illustrated in FIG. 13B, an impurity element imparting n-type conductivity is added to the semiconductor film 604 by using the electrode 607 and the sidewalls 612 as masks. This step is a step for forming impurity regions serving as a source region and a drain region in the semiconductor film 604. In this step, the impurity element imparting n-type conductivity is added to the semiconductor film 604 while the semiconductor film 603 is covered with a mask or the like.

In the above-described addition of the impurity element, the electrode 607 and the sidewalls 612 serve as masks; accordingly, a pair of n-type high-concentration impurity regions 614 are formed in the semiconductor film 604 in a self-alignment manner. Then, the mask covering the semiconductor film 603 is removed, and heat treatment is performed to activate the impurity element imparting p-type conductivity added to the semiconductor film 603 and the impurity element imparting n-type conductivity added to the semiconductor film 604. Through the sequence of the steps illustrated in FIGS. 12A to 13B, a p-channel transistor 617 and an n-channel transistor 618 are formed.

In order to reduce the resistance of the source and drain, a silicide layer may be formed by siliciding the high-concentration impurity regions 608 in the semiconductor film 603 and the high-concentration impurity regions 614 in the semiconductor film 604. The siliciding is performed by placing a metal in contact with the semiconductor film 603 and the semiconductor film 604 and causing reaction between the metal and silicon in the semiconductor films through heat treatment; in this manner, a silicide compound is generated. As the metal, cobalt or nickel is preferable, or the following can be used: titanium (Ti), tungsten (W), molybdenum (Mo), zirconium (Zr), hafnium (Hf), tantalum (Ta), vanadium (V), neodymium (Nd), chromium (Cr), platinum (Pt), palladium (Pd), or the like. In the case where the semiconductor film 603 and the semiconductor film 604 are thin, the silicide reaction may proceed to the bottom of the semiconductor film 603 and the semiconductor film 604 in this region. As the heat treatment for forming a silicide, a resistance heating furnace, an RTA apparatus, a microwave heating apparatus, or a laser irradiation apparatus can be used.

Figure 13C:
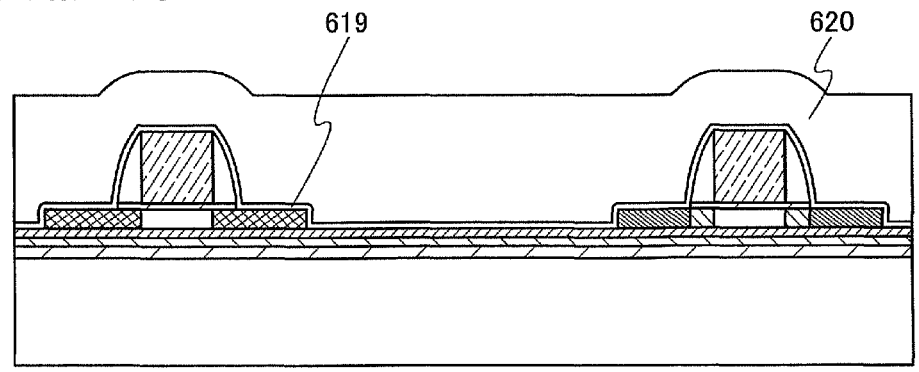

Next, as illustrated in FIG. 13C, an insulating film 619 is formed to cover the transistor 617 and the transistor 618. As the insulating film 619, an insulating film containing hydrogen is formed. In this embodiment mode, a silicon nitride oxide film with a thickness of approximately 600 nm is formed by a PECVD method using monosilane, ammonia, and $N_2O$ as a source gas. The insulating film 619 is made to contain hydrogen because hydrogen can be diffused from the insulating film 619 so that dangling bonds in the semiconductor film 603 and the semiconductor film 604 can be terminated. The formation of the insulating film 619 can prevent impurities such as an alkali metal and an alkaline earth metal from entering the transistor 617 and the transistor 618. Specifically, it is desirable to use silicon nitride, silicon nitride oxide, aluminum nitride, aluminum oxide, silicon oxide, or the like for the insulating film 619.

Next, an insulating film 620 is formed over the insulating film 619 so as to cover the transistor 617 and the transistor 618. An organic material having heat resistance, such as polyimide, acrylic, benzocyclobutene, polyamide, or epoxy can be used for the insulating film 620. In addition to such organic materials, it is also possible to use a low-dielectric constant material (a low-k material), a siloxane resin, silicon oxide, silicon nitride, silicon nitride oxide, PSG (phosphosilicate glass), BPSG (borophosphosilicate glass), alumina, or the like. A siloxane-based resin may include as a substituent at least one of fluorine, an alkyl group, and an aryl group, as well as hydrogen. Alternatively, the insulating film 620 may be formed by stacking plural insulating films formed of these materials. The insulating film 620 may have its surface flattened by a CMP method or the like.

Note that the siloxane-based resin corresponds to a resin including a Si—O—Si bond formed using a siloxane-based material as a starting material. The siloxane-based resin may include as a substituent at least one of fluorine, an alkyl group, and aromatic hydrocarbon, as well as hydrogen.

For the formation of the insulating film 620, the following method can be used depending on the material of the insulating film 620: a CVD method, a sputtering method, an SOG method, a spin coating method, a dip coating method, a spray coating method, a droplet discharge method (e.g., an inkjet method, screen printing, or offset printing), a doctor knife, a roll coater, a curtain coater, a knife coater, or the like.

Next, heat treatment at approximately 400° C. to 450° C. (e.g., 410° C.) is performed in a nitrogen atmosphere for 1 hour, so that hydrogen is made to diffuse from the insulating film 619 and dangling bonds in the semiconductor film 603 and the semiconductor film 604 are terminated with hydrogen. Since the single crystal semiconductor layers 116 have a much lower defect density than a polycrystalline silicon film which is formed by crystallizing an amorphous silicon film, this termination treatment with hydrogen can be performed in short time.

Figure 14:
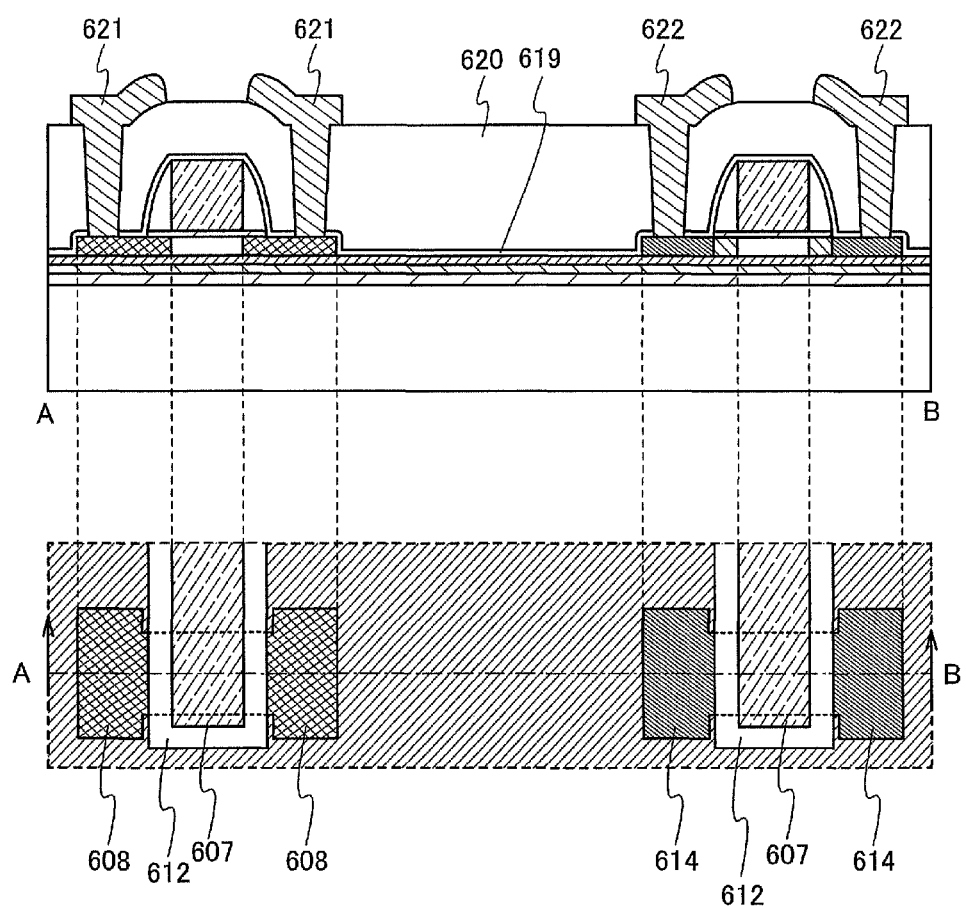
FIG. 14 is a cross-sectional view and a top view of a semiconductor device.

Next, as illustrated in FIG. 14, contact holes are formed in the insulating film 619 and the insulating film 620 so that the semiconductor film 603 and the semiconductor film 604 are partially exposed. The formation of the contact holes can be performed by a dry etching method using a mixed gas of $CHF_3$ and He; however, the present invention is not limited to this. Then, conductive films 621 and conductive films 622 are formed to be in contact with the semiconductor film 603 and the semiconductor film 604, respectively through the contact holes. The conductive films 621 are connected to the high-concentration impurity regions 608 of the p-channel transistor 617. The conductive films 622 are connected to the high-concentration impurity regions 614 of the p-channel transistor 618.

The conductive films 621 and the conductive films 622 can be formed by a CVD method, a sputtering method, or the like.

Specifically, the following can be used for the conductive films 621 and the conductive films 622: aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-described metal as a main component or a compound containing the above-described metal can also be used. The conductive films 621 and the conductive films 622 can be formed of a single layer or a plurality of layers using a film formed of the above-described metal.

As an example of an alloy containing aluminum as its main component, an alloy containing aluminum as its main component and also containing nickel is given. Further, an alloy which contains aluminum as its main component and contains nickel and one or both of carbon and silicon can also be given. Since aluminum and aluminum silicon have low resistance values and are inexpensive, aluminum and aluminum silicon are suitable as a material for forming the conductive films 621 and the conductive films 622. In particular, when the shape of an aluminum silicon (Al—Si) film is processed by etching, generation of hillocks in resist baking for forming an etching mask can be prevented more than in the case where an aluminum film is used. Instead of silicon (Si), Cu may be mixed into an aluminum film at about 0.5%.

For example, a stacked structure including a barrier film, an aluminum silicon (Al—Si) film, and a barrier film or a stacked structure including a barrier film, an aluminum silicon (Al—Si) film, a titanium nitride film, and a barrier film may be used for the conductive films 621 and the conductive films 622. Note that the barrier film refers to a film formed using titanium, a nitride of titanium, molybdenum, or a nitride of molybdenum. When barrier films are formed to sandwich an aluminum silicon (Al—Si) film therebetween, generation of hillocks of aluminum or aluminum silicon can be prevented more effectively. Moreover, when the barrier film is formed using titanium that is a highly-reducible element, even if a thin oxide film is formed over the semiconductor film 603 and the semiconductor film 604, the oxide film is reduced by the titanium contained in the barrier film, whereby preferable contact between the conductive films 621 and 622 and the semiconductor films 603 and 604 can be obtained. Further, it is also possible to stack a plurality of barrier films. In that case, for example, a five-layer structure in which titanium, titanium nitride, aluminum silicon, titanium, and titanium nitride are stacked from the lowest layer can be used for the conductive films 621 and the conductive films 622.

For the conductive films 621 and the conductive films 622, tungsten silicide formed by a chemical vapor deposition method using a $WF_6$ gas and a $SiH_4$ gas may be used. Alternatively, tungsten formed by hydrogen reduction of $WF_6$ may be used for the conductive films 621 and the conductive films 622.

In FIG. 14, a top view of the p-channel transistor 617 and the n-channel transistor 618 and a cross-sectional view taken along a line A-B of the top view are illustrated. Note that the conductive films 621, the conductive films 622, the insulating film 619, and the insulating film 620 are omitted in top view of FIG. 14.

Although the case where each of the n-channel transistor 617 and the p-channel transistor 618 has one electrode 607 functioning as a gate is described in this embodiment mode, the present invention is not limited to this structure. The transistor manufactured in the present invention may have a multi-gate structure in which a plurality of electrodes functioning as gates are included and electrically connected to one another.

Moreover, the transistors included in the semiconductor device manufactured in the present invention may have a gate planar structure.

Note that since a semiconductor layer included in the substrate of the present invention provided with semiconductor films is a sliced layer of a single crystal semiconductor substrate, orientation does not vary. Consequently, variation in electric characteristics such as threshold voltage and mobility of a plurality of transistors manufactured using a semiconductor substrate can be made to be small. Further, since there is basically no crystal grain boundary, a leak current due to a crystal grain boundary can be suppressed, as well as realize power saving of a semiconductor device. Accordingly, a highly reliable semiconductor device can be manufactured.

In the case of manufacturing a transistor from a polycrystalline semiconductor film obtained by laser crystallization, it has been necessary to decide a layout of the semiconductor film of the transistor taking into consideration a scanning direction of laser light, in order to obtain high mobility. However, there is no such need for the substrate of the present invention provided with semiconductor films, and there is little restrictions in designing a semiconductor device.

Embodiment Mode 4

In Embodiment Mode 3, a manufacturing method of a TFT is described as an example of a manufacturing method of a semiconductor device. By forming various semiconductor elements such as a capacitor, resistor, and the like together with a TFT over a substrate provided with semiconductor films, a high-value added semiconductor device can be manufactured. In this embodiment mode, a specific mode of a semiconductor device will be described with reference to drawings.

Figure 15:
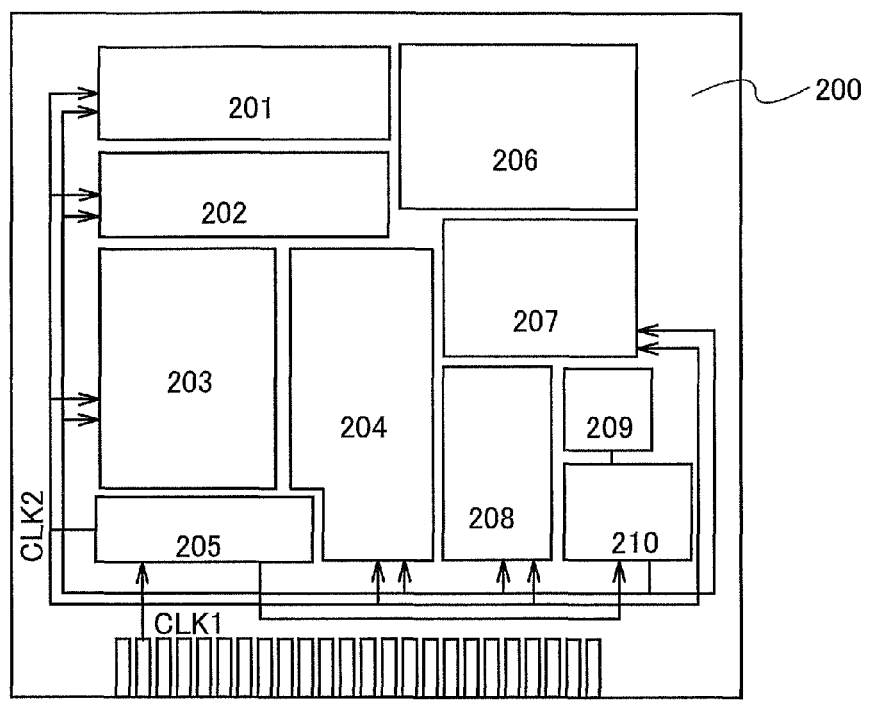
FIG. 15 is a block diagram illustrating an example of a structure of a microprocessor.

First, as an example of a semiconductor device, a microprocessor will be described. FIG. 15 is a block diagram illustrating a structural example of a microprocessor 200.

The microprocessor 200 includes an arithmetic logic unit (ALU) 201, an ALU controller 202, an instruction decoder 203, an interrupt controller 204, a timing controller 205, a register 206, a register controller 207, a bus interface (bus I/F) 208, a read only memory (ROM) 209, and a memory interface 210.

An instruction input to the microprocessor 200 via the bus interface 208 is input to the instruction decoder 203 and decoded, and then input to the ALU controller 202, the interrupt controller 204, the register controller 207, and the timing controller 205. The ALU controller 202, the interrupt controller 204, the register controller 207, and the timing controller 205 perform various controls based on the decoded instruction.

The ALU controller 202 generates a signal for controlling an operation of the ALU 201. The interrupt controller 204 is a circuit that processes an interruption request from an external input/output device or a peripheral circuit during program execution of the microprocessor 200, and the interrupt controller 204 determines priority of the interruption request or a masked state and processes the interruption request. The register controller 207 generates an address of the register 206 and performs reading and writing from/to the register 206 depending on a state of the microprocessor 200. The timing controller 205 generates signals controlling timing of operation of the ALU 201, the ALU controller 202, the instruction decoder 203, the interrupt controller 204, and the register controller 207. For example, the timing controller 205 is provided with an internal clock generator that generates an internal clock signal CLK2 based on a reference clock signal CLK1. As illustrated in FIG. 15, the internal clock signal CLK2 is input to another circuit.

Figure 16:
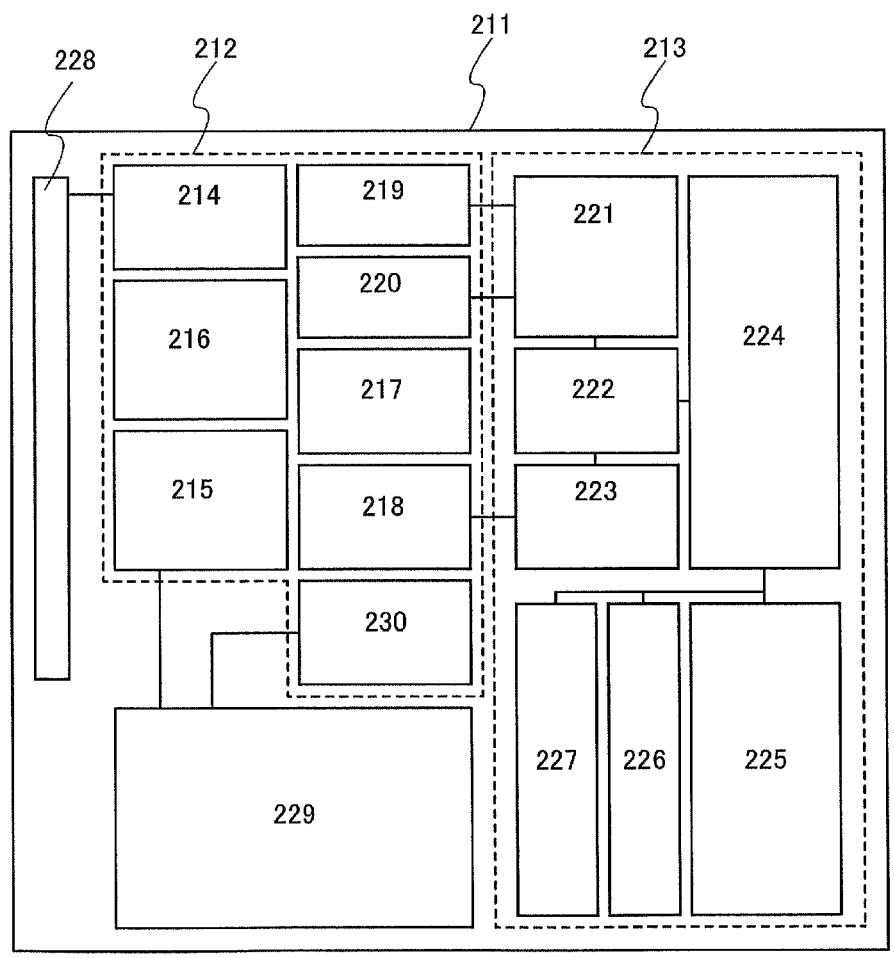
FIG. 16 is a block diagram illustrating an example of a structure of a semiconductor device.

Next, an example of a semiconductor device provided with a function for performing transmission/reception of data without contact and an arithmetic function are described. FIG. 16 is a block diagram illustrating a structural example of such a semiconductor device. A semiconductor device 211 illustrated in FIG. 16 functions as an arithmetic processing unit that operates by transmitting/receiving a signal to/from an external device through wireless communication.

As illustrated in FIG. 16, the semiconductor device 211 includes an analog circuit portion 212 and a digital circuit portion 213. The analog circuit portion 212 includes a resonance circuit 214 having a resonant capacitor, a rectification circuit 215, a constant-voltage circuit 216, a reset circuit 217, oscillation circuit 218, a demodulation circuit 219, and a modulation circuit 220. Further, the digital circuit portion 213 includes an RF interface 221, a control register 222, a clock controller 223, an interface 224, a central processing unit (CPU) 225, a random access memory (RAM) 226, and a read only memory (ROM) 227.

A summary of the operation of the semiconductor device 211 is as follows. An induced electromotive force is generated in the resonance circuit 214 using a signal received by an antenna 228. The induced electromotive force passes through the rectification circuit 215 and charges a capacitor 229. This capacitor 229 is preferably a capacitor such as a ceramic capacitor or an electric double layer capacitor. The capacitor 229 does not always have to be integrated with a substrate included in the semiconductor device 211, and it may be mounted to the semiconductor device 211 as a different component.

The reset circuit 217 generates a signal that resets and initializes the digital circuit portion 213. For example, a signal that rises up lagging behind a rise in power supply voltage is generated as a reset signal. The oscillation circuit 218 changes the frequency and duty ratio of a clock signal depending on a control signal generated in the constant-voltage circuit 216. The demodulation circuit 219 is a circuit that demodulates a reception signal, and the modulation circuit 220 is a circuit that modulates data to be transmitted.

For example, the demodulation circuit 219 is formed using a low-pass filter and binarizes an amplitude-modulated (ASK) received signal based on variation of amplitude. Since the modulation circuit 220 varies the amplitude of an amplitude-modulated (ASK) transmission signal and transmits the data, the modulation circuit 220 changes the amplitude of a communication signal by changing a resonance point of the resonance circuit 214.

The clock controller 223 generates a control signal for changing the frequency and duty ratio of a clock signal depending on power supply voltage or current consumption in the CPU 225. Monitoring of the power supply voltage is performed in a power supply management circuit 230.

A signal input to the semiconductor device 211 from the antenna 228 is demodulated in the demodulation circuit 219, and then separated into a control command, data, and the like in the RF interface 221. The control command is stored in the control register 222. In the control command, instructions for reading data that is stored in the ROM 227, writing data in the RAM 226, performing an arithmetic calculation in the CPU 225, and the like are included.

The CPU 225 accesses the ROM 227, the RAM 226, and the control register 222 via the interface 224. The interface 224 has a function of generating an access signal corresponding to any of the ROM 227, the RAM 226, and the control register 222, based on an address requested by the CPU 225.

As an arithmetic method of the CPU 225, a method may be employed in which an operating system (OS) is stored in the ROM 227 and a program is read and executed at the time of starting operation. Alternatively, a method may be employed in which a dedicated circuit is provided as an arithmetic circuit and an arithmetic process is performed using hardware. In a method of using both hardware and software, part of an arithmetic process is performed in a dedicated arithmetic circuit, and then the rest of the arithmetic process is performed using a program in the CPU 225.

Next, a display device is described as a structural example of a semiconductor device, with reference to FIG. 17, FIGS. 18A and 18B, and FIGS. 19A and 19B.

Figure 17:
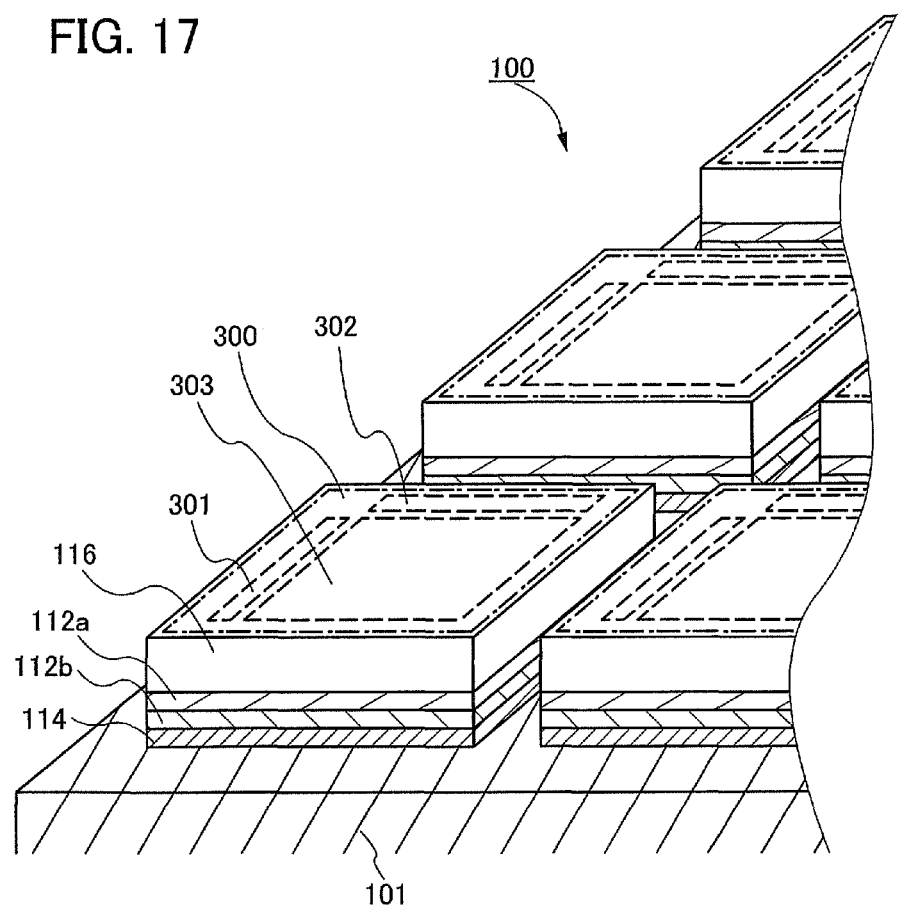
FIG. 17 is a perspective view illustrating a main portion of a substrate provided with semiconductor films.

FIG. 17 is a diagram illustrating a main portion of the semiconductor substrate 100 manufactured according to the manufacturing method in Embodiment Mode 1. From a single semiconductor substrate 100, a plurality of display panels each included in a display device can be manufactured. In FIG. 17, an example of a circuit arrangement for manufacturing one display device from one single crystal semiconductor layer 116 is illustrated. For each single crystal semiconductor layer 116, a display panel formation region 300 is formed. In a display device, a scan line driver circuit, a signal line driver circuit, and a pixel portion are included. Accordingly, each display panel formation region 300 has regions in which they are formed (a scan line driver circuit formation region 301, a signal line driver circuit formation region 302, and a pixel formation region 303).

Figure 18A:
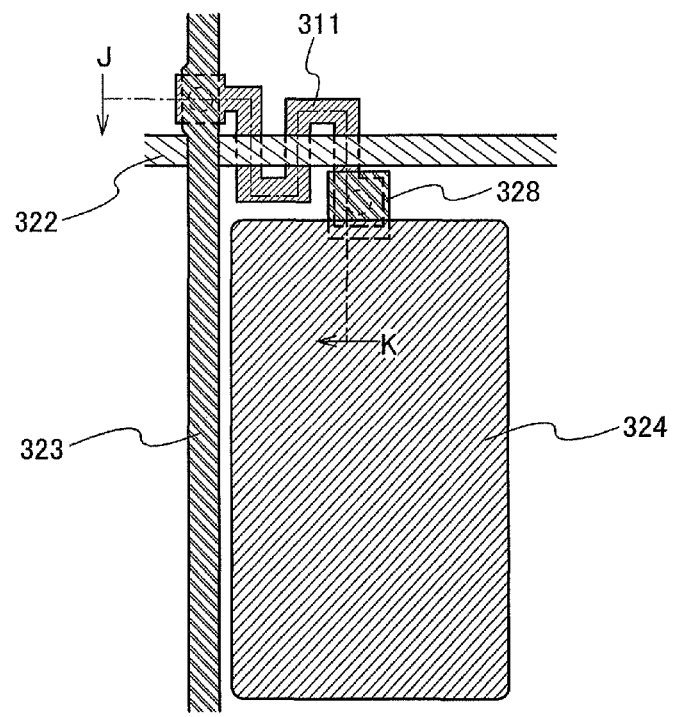
FIG. 18A is a plan view of a pixel of a liquid crystal display device and FIG. 18B is a cross-sectional view of FIG. 18A taken along a section line J-K.
Figure 18B:
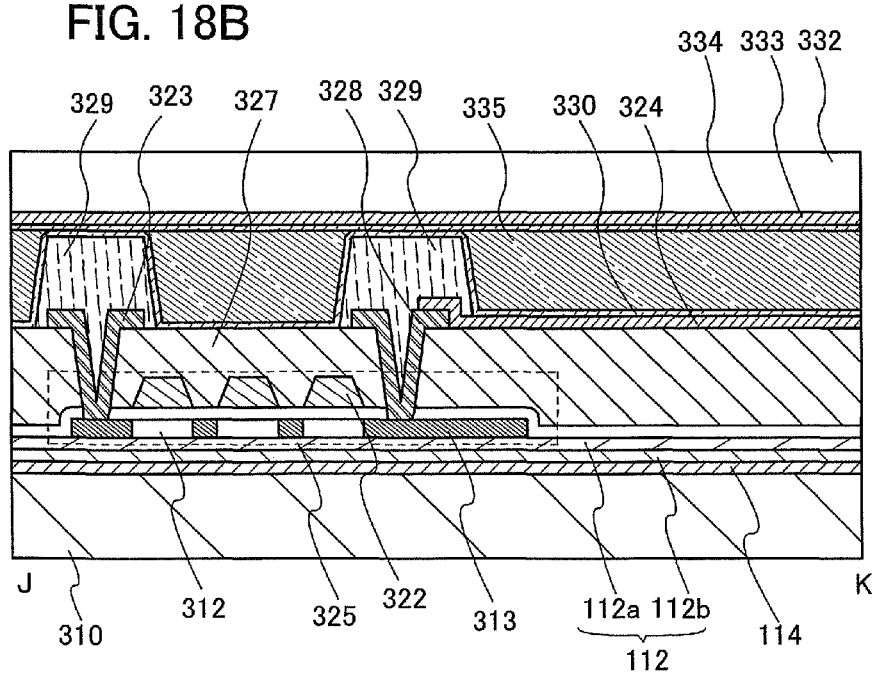

FIGS. 18A and 18B are diagrams illustrating a structural example of a liquid crystal display device. FIG. 18A is a plan view of a pixel of the liquid crystal display device, and FIG. 18B is a cross-sectional view of the diagram of FIG. 18A along a section line J-K. In FIG. 18A, a semiconductor layer 311 is a layer formed from the single crystal semiconductor layer 116, and forms a TFT 325 of the pixel. The pixel includes the semiconductor layer 311; a scan line 322 that crosses the semiconductor layer 311; a signal line 323 that crosses the scan line 322; a pixel electrode 324; and an electrode 328 that is electrically connected to the pixel electrode 324 and the semiconductor layer 311.

As illustrated in FIG. 18B, the bonding layer 114, the insulating layer 112 including the insulating film 112b and the insulating film 112a, and the semiconductor layer 311 are stacked over a substrate 310. The substrate 310 is a separated base substrate 101. The semiconductor layer 311 is a layer formed by element separation of the single crystal semiconductor layer 116 by etching. In the semiconductor layer 311, a channel formation region 312 and an n-type impurity region 313 are formed. A gate electrode of the TFT 325 is included in the scan line 322, and one of a source electrode and a drain electrode is included in the signal line 323.

Over an interlayer insulating film 327, the signal line 323, the pixel electrode 324, and the electrode 328 are provided. Over the interlayer insulating film 327, a columnar spacer 329 is formed, and an orientation film 330 is formed so as to cover the signal line 323, the pixel electrode 324, the electrode 328, and the columnar spacer 329. Over an opposing substrate 332, an opposing electrode 333 and an orientation film 334 that covers the opposing electrode are formed. The columnar spacer 329 is formed to maintain a space between the substrate 310 and the opposing substrate 332. In the space formed by the columnar spacer 329, a liquid crystal layer 335 is formed. At connection portions of the signal line 323 and the electrode 328 with the impurity region 313, because there are steps formed in the interlayer insulating film 327 due to formation of contact holes, orientation of liquid crystals in the liquid crystal layer 335 in these connection portions becomes disordered easily. Accordingly, the columnar spacer 329 is formed at these step portions to prevent orientation disorder of liquid crystal.

Figure 19A:
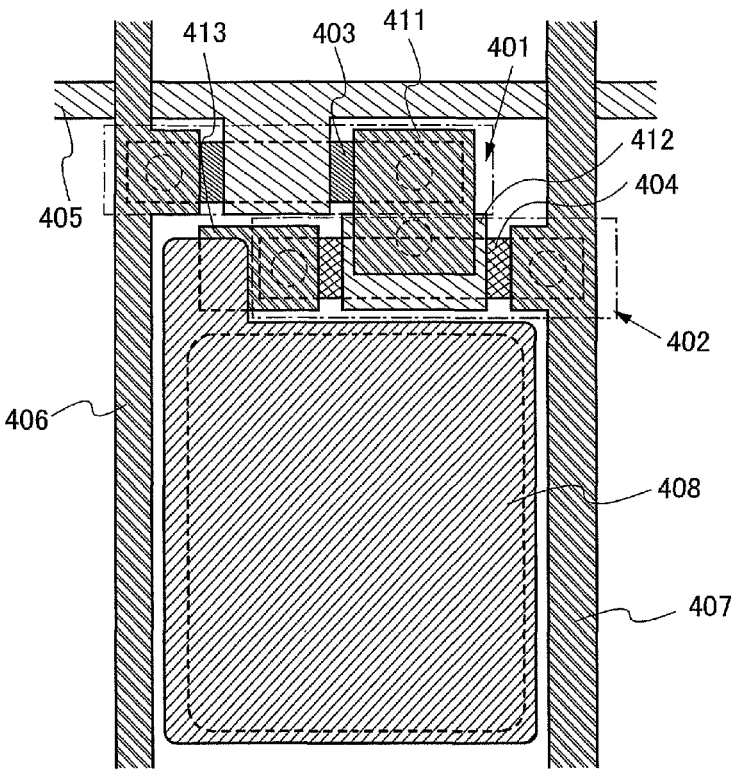
FIG. 19A is a plan view of a pixel of an electroluminescent display device and FIG. 19B is a cross-sectional view of FIG. 19A.
Figure 19B:
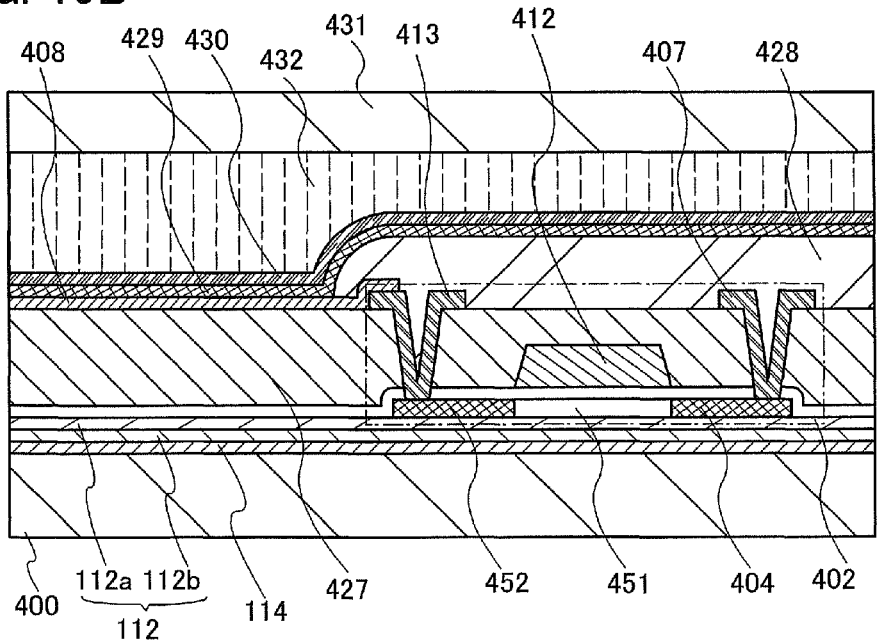

Next, an electroluminescent display device (hereinafter referred to as an "EL display device") will be described. FIGS. 19A and 19B are diagrams for describing an EL display device manufactured according to the method in Embodiment Mode 2. FIG. 19A is a plan view of a pixel of the EL display device, and FIG. 19B is a cross-sectional view of the pixel. As illustrated in FIG. 19A, the pixel includes a selection transistor 401 made of a TFT, a display control transistor 402, a scan line 405, a signal line 406, a current supply line 407, and a pixel electrode 408. Each pixel is provided with a light-emitting element with a structure in which a layer formed to contain an electroluminescent material (EL layer) is interposed between a pair of electrodes. One of the electrodes of the light-emitting element is the pixel electrode 408.

The selection transistor 401 is an n-channel TFT, and includes the semiconductor layer 403 that is made of the single crystal semiconductor layer 116. In the selection transistor 401, a gate electrode is included in the scan line 405, one of source and drain electrodes is included in the signal line 406, and the other of the source and drain electrodes is formed as an electrode 411. In the display control transistor 402, a gate electrode 412 is electrically connected to the electrode 411, and one of source and drain electrodes is formed as an electrode 413 that is electrically connected to the pixel electrode 408, and the other of the source and drain electrodes is included in the current supply line 407.

The display transistor 402 is a p-channel TFT, and includes the semiconductor layer 404 that is made of the single crystal semiconductor layer 116. As illustrated in FIG. 19B, in the semiconductor layer 404, a channel formation region 451 and a p-type impurity region 452 are formed. An interlayer insulating film 427 is formed so as to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the electrode 408, and an opposing electrode 430 is formed over the EL layer 429. An opposing substrate 431 is provided as a reinforcing plate, and the opposing substrate 431 is fixed to a substrate 400 with a resin layer 432. The substrate 400 is a separated base substrate 101.

Note that in the semiconductor substrate 100 in FIG. 17, the semiconductor device described with reference to FIG. 15 or FIG. 16 can be formed in the display panel formation region 300. That is, a computer function can be provided in a display device. Further, a display device capable of inputting/outputting date without contact can be manufactured.

Accordingly, various electronic appliances can be manufactured using the semiconductor substrate 100. The electronic appliances include cameras such as a video camera and a digital camera; a navigation system; a sound reproduction system (a car audio system, an audio component, and the like); a computer; a game machine; a mobile information terminal (a mobile computer, a cellular phone, a mobile game machine, an electronic book, and the like); a display device that displays image data such as an image reproduction device provided with a recording medium (specifically, a digital versatile disc (DVD)); and the like.

Figure 20A:
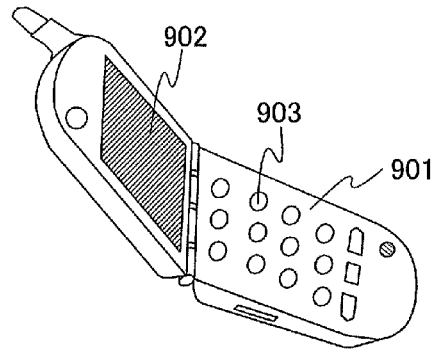
FIGS. 20A to 20C are perspective views of a cellular phone, a digital player, and an electronic book, respectively.
Figure 20B:
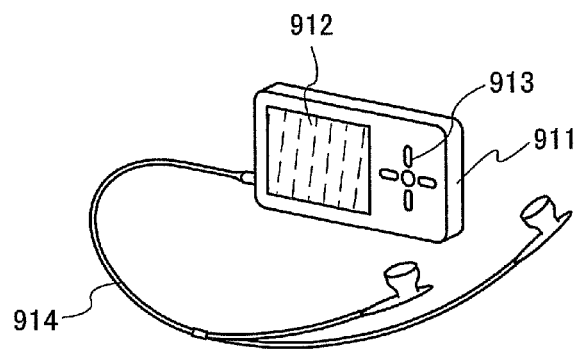
Figure 20C:
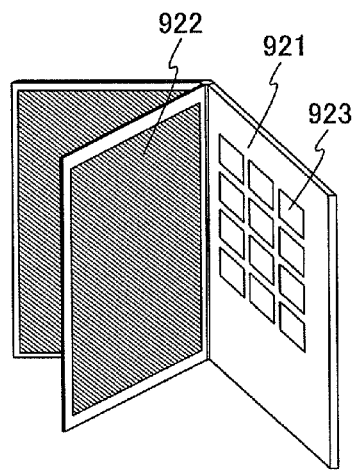

With reference to FIGS. 20A to 20C, specific modes of the electronic appliance are described. FIG. 20A is an external view illustrating an example of a cellular phone 901. This cellular phone 901 has a structure in which a display portion 902, an operation switch 903, and the like are included. By applying the liquid crystal display device described in FIGS. 18A and 18B or the EL display device described in FIGS. 19A and 19B to the display portion 902, the display portion 902 can have excellent image quality with little display unevenness.

FIG. 20B is an external view illustrating a structural example of a digital player 911. The digital player 911 includes a display portion 912, an operation portion 913, an earpiece 914, and the like. Alternatively, headphones or a wireless earpiece can be used instead of the earpiece 914. By applying the liquid crystal display device described in FIGS. 18A and 18B or the EL display device described in FIGS. 19A and 19B to the display portion 912, even in the case where the screen size is about 0.3 inches to 2 inches, an image with high precision and a large amount of text information can be displayed.

FIG. 20C is an external view of an electronic book 921. This electronic book 921 includes a display portion 922 and an operation switch 923. A modem may be incorporated into the electronic book 921, or the semiconductor device in FIG. 16 may be incorporated so that the electronic book 921 has a structure by which information can be transmitted/received wirelessly. By applying the liquid crystal display device described in FIGS. 18A and 18B or the EL display device described in FIGS. 19A and 19B to the display portion 922, a display with high image quality can be performed.

Embodiment Mode 5

In this embodiment mode, a tray used for manufacturing a substrate provided with semiconductor films is described. The tray 10 in FIG. 3 has a plurality of depression portions 11 each for storing one single crystal semiconductor substrate. Alternatively, a substrate provided with semiconductor films can be manufactured by placing a plurality of single crystal semiconductor substrates in one depression portion of the tray.

Figure 21:
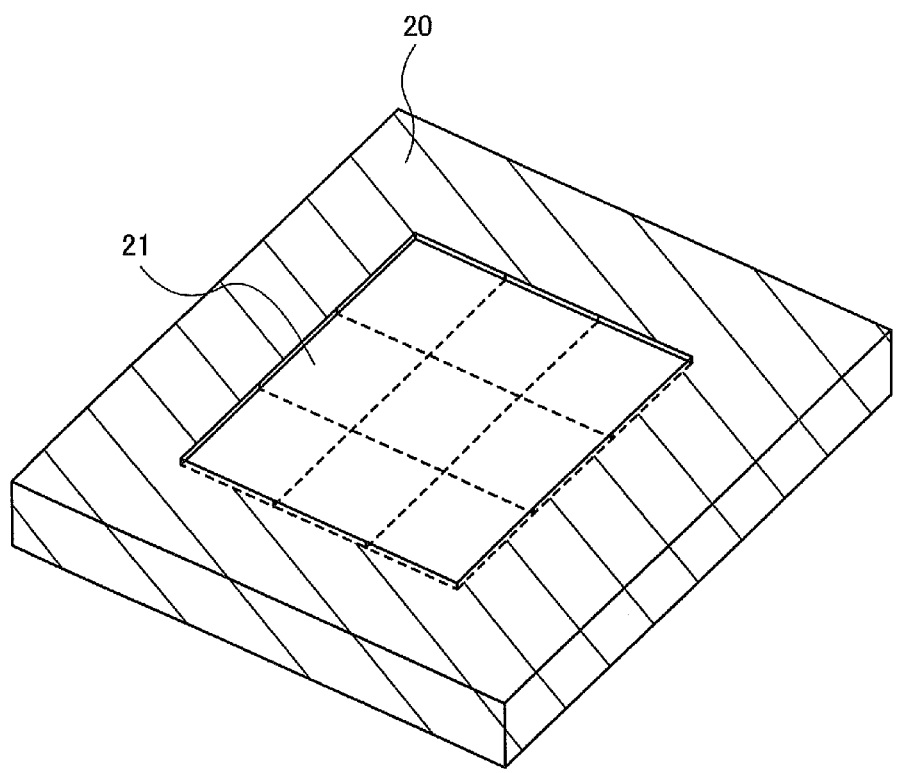
FIG. 21 is a perspective view describing an example of a structure of a tray.

An example of a tray with such a structure is illustrated in FIG. 21. A tray 20 is a plate-like member formed of a similar material to the material of the tray 10. A depression portion 21 for holding the single crystal semiconductor substrate 111 is formed. The depression portion 21 is to have a shape in which a plurality of single crystal semiconductor substrates 111 can be arranged with no space between them. On the tray 20 in FIG. 21 for example, the depression portion 11 is illustrated in the case that a three-by-three arrangement of the single crystal semiconductor substrates 111 is considered as one block.

This application is based on Japanese Patent Application serial no. 2007-245898 filed with Japan Patent Office on Sep. 21, 2007, the entire contents of which are hereby incorporated by reference.

What is claimed is:
1. A manufacturing method of a substrate provided with semiconductor films, comprising:
 preparing a base substrate and a plurality of single crystal semiconductor substrates;
 forming on a first tray, a damaged region at a desired depth of each of the plurality of single crystal semiconductor substrates by irradiating the plurality of single crystal semiconductor substrates with ions, an insulating layer over an upper surface of each of the plurality of single crystal semiconductor substrates, and a bonding layer over the insulating layer;

disposing on a second tray, the plurality of single crystal semiconductor substrates with the damaged region, the insulating layer, and the bonding layer;
making the plurality of single crystal semiconductor substrates in close contact with the base substrate with the bonding layer interposed therebetween, so that the base substrate and the plurality of single crystal semiconductor substrates are bonded to each other; and
generating cracks in the damaged region by heating the plurality of single crystal semiconductor substrates, so that a plurality of single crystal semiconductor layers separated from the plurality of single crystal semiconductor substrates are formed over the base substrate,
wherein each of the plurality of single crystal semiconductor substrates has a length of a long side which is n times a length of a side of one shot of a light-exposing region of a reduced projection exposure apparatus (n is an arbitrary positive integer, and n≥1), and
wherein each of the first tray and the second tray is a plate-like member provided with a plurality of depression portions which have a rectangular shape.

2. The manufacturing method of a substrate provided with semiconductor films according to claim 1, further comprising a step of irradiating the plurality of single crystal semiconductor layers over the base substrate with a laser beam.

3. The manufacturing method of a substrate provided with semiconductor films according to claim 1, wherein the base substrate is aluminosilicate glass, aluminoborosilicate glass, barium borosilicate glass, quartz, ceramic, or sapphire.

4. A manufacturing method of a substrate provided with semiconductor films, comprising:
preparing a base substrate and a plurality of single crystal semiconductor substrates;
forming on a first tray, an insulating layer over an upper surface of each of the plurality of single crystal semiconductor substrates;
forming on a second tray, a damaged region at a desired depth of each of the plurality of single crystal semiconductor substrates by irradiating the plurality of single crystal semiconductor substrates with ions;
forming on a third tray, a bonding layer over each of the plurality of single crystal semiconductor substrates with the insulating layer interposed therebetween;
disposing on a fourth tray, the plurality of single crystal semiconductor substrates with the damaged region, the insulating layer, and the bonding layer;
making the plurality of single crystal semiconductor substrates in close contact with the base substrate with the bonding layer interposed therebetween, so that the base substrate and the plurality of single crystal semiconductor substrates are bonded to each other; and
generating cracks in the damaged region by heating the plurality of single crystal semiconductor substrates, so that a plurality of single crystal semiconductor layers separated from the plurality of single crystal semiconductor substrates are formed over the base substrate,
wherein each of the plurality of single crystal semiconductor substrates has a length of a long side which is n times a length of a side of one shot of a light-exposing region of a reduced projection exposure apparatus (n is an arbitrary positive integer, and n≥1), and
wherein each of the first tray, the second tray, the third tray and the fourth tray is a plate-like member provided with a plurality of depression portions which have a rectangular shape.

5. The manufacturing method of a substrate provided with semiconductor films according to claim 4, further comprising a step of irradiating the plurality of single crystal semiconductor layers over the base substrate with a laser beam.

6. The manufacturing method of a substrate provided with semiconductor films according to claim 4, wherein the base substrate is aluminosilicate glass, aluminoborosilicate glass, barium borosilicate glass, quartz, ceramic, or sapphire.

7. A manufacturing method of a substrate provided with semiconductor films, comprising:
preparing a base substrate and a plurality of single crystal semiconductor substrates;
forming on a first tray, an insulating layer over an upper surface of each of the plurality of single crystal semiconductor substrates;
forming on a second tray, a bonding layer over each of the plurality of single crystal semiconductor substrates with the insulating layer interposed therebetween;
forming on a third tray, a damaged region at a desired depth of each of the plurality of single crystal semiconductor substrates by irradiating the plurality of single crystal semiconductor substrates with ions;
disposing on a fourth tray, the plurality of single crystal semiconductor substrates with the damaged region, the insulating layer, and the bonding layer;
making the plurality of single crystal semiconductor substrates in close contact with the base substrate with the bonding layer interposed therebetween, so that the base substrate and the plurality of single crystal semiconductor substrates are bonded to each other; and
generating cracks in the damaged region by heating the plurality of single crystal semiconductor substrates, so that a plurality of single crystal semiconductor layers separated from the plurality of single crystal semiconductor substrates are formed over the base substrate,
wherein each of the plurality of single crystal semiconductor substrates has a length of a long side which is n times a length of a side of one shot of a light-exposing region of a reduced projection exposure apparatus (n is an arbitrary positive integer, and n≥1), and
wherein each of the first tray, the second tray, the third tray and the fourth tray is a plate-like member provided with a plurality of depression portions which have a rectangular shape.

8. The manufacturing method of a substrate provided with semiconductor films according to claim 7, further comprising a step of irradiating the plurality of single crystal semiconductor layers over the base substrate with a laser beam.

9. The manufacturing method of a substrate provided with semiconductor films according to claim 7, wherein the base substrate is aluminosilicate glass, aluminoborosilicate glass, barium borosilicate glass, quartz, ceramic, or sapphire.

10. A manufacturing method of a substrate provided with semiconductor films, comprising:
preparing a base substrate and a plurality of single crystal semiconductor substrates;
forming on a first tray, a damaged region at a desired depth of each of the plurality of single crystal semiconductor substrates by irradiating the plurality of single crystal semiconductor substrates with ions;
forming on a second tray, an insulating layer over an upper surface of each of the plurality of single crystal semiconductor substrates;
forming on a third tray, a bonding layer over each of the plurality of single crystal semiconductor substrates with the insulating layer interposed therebetween;
disposing on a fourth tray, the plurality of single crystal semiconductor substrates with the damaged region, the insulating layer, and the bonding layer;

making the plurality of single crystal semiconductor substrates in close contact with the base substrate with the bonding layer interposed therebetween, so that the base substrate and the plurality of single crystal semiconductor substrates are bonded to each other; and generating cracks in the damaged region by heating the plurality of single crystal semiconductor substrates, so that a plurality of single crystal semiconductor layers separated from the plurality of single crystal semiconductor substrates are formed over the base substrate, wherein each of the plurality of single crystal semiconductor substrates has a length of a long side which is n times a length of a side of one shot of a light-exposing region of a reduced projection exposure apparatus (n is an arbitrary positive integer, and n≥1), and wherein each of the first tray, the second tray, the third tray and the fourth tray is a plate-like member provided with a plurality of depression portions which have a rectangular shape.

11. The manufacturing method of a substrate provided with semiconductor films according to claim 10, further comprising a step of irradiating the plurality of single crystal semiconductor layers over the base substrate with a laser beam.

12. The manufacturing method of a substrate provided with semiconductor films according to claim 10, wherein the base substrate is aluminosilicate glass, aluminoborosilicate glass, barium borosilicate glass, quartz, ceramic, or sapphire.

13. A manufacturing method of a substrate provided with semiconductor films, comprising:
    preparing a base substrate and a plurality of single crystal semiconductor substrates;
    forming on a first tray, a damaged region at a desired depth of each of the plurality of single crystal semiconductor substrates by irradiating the plurality of single crystal semiconductor substrates with ions, an insulating layer over an upper surface of each of the plurality of single crystal semiconductor substrates, and a bonding layer over the insulating layer;
    disposing on a second tray, the plurality of single crystal semiconductor substrates with the damaged region, the insulating layer, and the bonding layer;
    making the plurality of single crystal semiconductor substrates in close contact with the base substrate with the bonding layer interposed therebetween, so that the base substrate and the plurality of single crystal semiconductor substrates are bonded to each other; and
    generating cracks in the damaged region by heating the plurality of single crystal semiconductor substrates, so that a plurality of single crystal semiconductor layers separated from the plurality of single crystal semiconductor substrates are formed over the base substrate,
    wherein the insulating layer is a single layer or two or more layers,
    wherein a step of forming the insulating layer is performed in a reaction chamber containing a fluoride gas or a fluorine gas by introducing a process gas into the reaction chamber, generating plasma by excitation of the process gas, and causing chemical reaction of an active species included in the plasma,
    wherein each of the plurality of single crystal semiconductor substrates has a length of a long side which is n times a length of a side of one shot of a light-exposing region of a reduced projection exposure apparatus (n is an arbitrary positive integer, and n≥1), and
    wherein each of the first tray and the second tray is a plate-like member provided with a plurality of depression portions which have a rectangular shape.

14. The manufacturing method of a substrate provided with semiconductor films according to claim 13, further comprising a step of irradiating the plurality of single crystal semiconductor layers over the base substrate with a laser beam.

15. The manufacturing method of a substrate provided with semiconductor films according to claim 13, wherein the base substrate is aluminosilicate glass, aluminoborosilicate glass, barium borosilicate glass, quartz, ceramic, or sapphire.

16. A manufacturing method of a substrate provided with semiconductor films, comprising:
    preparing a base substrate and a plurality of single crystal semiconductor substrates;
    forming on a first tray, an insulating layer over an upper surface of each of the plurality of single crystal semiconductor substrates;
    forming on a second tray, a damaged region at a desired depth of each of the plurality of single crystal semiconductor substrates by irradiating the plurality of single crystal semiconductor substrates with ions;
    forming on a third tray, a bonding layer over each of the plurality of single crystal semiconductor substrates with the insulating layer interposed therebetween;
    disposing on a fourth tray, the plurality of single crystal semiconductor substrates with the damaged region, the insulating layer, and the bonding layer;
    making the plurality of single crystal semiconductor substrates in close contact with the base substrate with the bonding layer interposed therebetween, so that the base substrate and the plurality of single crystal semiconductor substrates are bonded to each other; and
    generating cracks in the damaged region by heating the plurality of single crystal semiconductor substrates, so that a plurality of single crystal semiconductor layers separated from the plurality of single crystal semiconductor substrates are formed over the base substrate,
    wherein the insulating layer is a single layer or two or more layers,
    wherein a step of forming the insulating layer is performed in a reaction chamber containing a fluoride gas or a fluorine gas by introducing a process gas into the reaction chamber, generating plasma by excitation of the process gas, and causing chemical reaction of an active species included in the plasma,
    wherein each of the plurality of single crystal semiconductor substrates has a length of a long side which is n times a length of a side of one shot of a light-exposing region of a reduced projection exposure apparatus (n is an arbitrary positive integer, and n≥1), and
    wherein each of the first tray, the second tray, the third tray and the fourth tray is a plate-like member provided with a plurality of depression portions which have a rectangular shape.

17. The manufacturing method of a substrate provided with semiconductor films according to claim 16, further comprising a step of irradiating the plurality of single crystal semiconductor layers over the base substrate with a laser beam.

18. The manufacturing method of a substrate provided with semiconductor films according to claim 16, wherein the base substrate is aluminosilicate glass, aluminoborosilicate glass, barium borosilicate glass, quartz, ceramic, or sapphire.

19. A manufacturing method of a substrate provided with semiconductor films, comprising:
    preparing a base substrate and a plurality of single crystal semiconductor substrates;
    forming on a first tray, an insulating layer over an upper surface of each of the plurality of single crystal semiconductor substrates;

forming on a second tray, a bonding layer over each of the plurality of single crystal semiconductor substrates with the insulating layer interposed therebetween;

forming on a third tray, a damaged region at a desired depth of each of the plurality of single crystal semiconductor substrates by irradiating the plurality of single crystal semiconductor substrates with ions;

disposing on a fourth tray, the plurality of single crystal semiconductor substrates with the damaged region, the insulating layer, and the bonding layer;

making the plurality of single crystal semiconductor substrates in close contact with the base substrate with the bonding layer interposed therebetween, so that the base substrate and the plurality of single crystal semiconductor substrates are bonded to each other; and generating cracks in the damaged region by heating the plurality of single crystal semiconductor substrates, so that a plurality of single crystal semiconductor layers separated from the plurality of single crystal semiconductor substrates are formed over the base substrate, wherein the insulating layer is a single layer or two or more layers, wherein a step of forming the insulating layer is performed in a reaction chamber containing a fluoride gas or a fluorine gas by introducing a process gas into the reaction chamber, generating plasma by excitation of the process gas, and causing chemical reaction of an active species included in the plasma, wherein each of the plurality of single crystal semiconductor substrates has a length of a long side which is n times a length of a side of one shot of a light-exposing region of a reduced projection exposure apparatus (n is an arbitrary positive integer, and n≥1), and wherein each of the first tray, the second tray, the third tray and the fourth tray is a plate-like member provided with a plurality of depression portions which have a rectangular shape.

20. The manufacturing method of a substrate provided with semiconductor films according to claim 19, further comprising a step of irradiating the plurality of single crystal semiconductor layers over the base substrate with a laser beam.

21. The manufacturing method of a substrate provided with semiconductor films according to claim 19, wherein the base substrate is aluminosilicate glass, aluminoborosilicate glass, barium borosilicate glass, quartz, ceramic, or sapphire.

22. A manufacturing method of a substrate provided with semiconductor films, comprising:

preparing a base substrate and a plurality of single crystal semiconductor substrates;

forming on a first tray, a damaged region at a desired depth of each of the plurality of single crystal semiconductor substrates by irradiating the plurality of single crystal semiconductor substrates with ions;

forming on a second tray, an insulating layer over an upper surface of each of the plurality of single crystal semiconductor substrates;

forming on a third tray, a bonding layer over each of the plurality of single crystal semiconductor substrates with the insulating layer interposed therebetween;

disposing on a fourth tray, the plurality of single crystal semiconductor substrates with the damaged region, the insulating layer, and the bonding layer;

making the plurality of single crystal semiconductor substrates in close contact with the base substrate with the bonding layer interposed therebetween, so that the base substrate and the plurality of single crystal semiconductor substrates are bonded to each other; and generating cracks in the damaged region by heating the plurality of single crystal semiconductor substrates, so that a plurality of single crystal semiconductor layers separated from the plurality of single crystal semiconductor substrates are formed over the base substrate, wherein the insulating layer is a single layer or two or more layers, wherein a step of forming the insulating layer is performed in a reaction chamber containing a fluoride gas or a fluorine gas by introducing a process gas into the reaction chamber, generating plasma by excitation of the process gas, and causing chemical reaction of an active species included in the plasma, wherein each of the plurality of single crystal semiconductor substrates has a length of a long side which is n times a length of a side of one shot of a light-exposing region of a reduced projection exposure apparatus (n is an arbitrary positive integer, and n≥1), and wherein each of the first tray, the second tray, the third tray and the fourth tray is a plate-like member provided with a plurality of depression portions which have a rectangular shape.

23. The manufacturing method of a substrate provided with semiconductor films according to claim 22, further comprising a step of irradiating the plurality of single crystal semiconductor layers over the base substrate with a laser beam.

24. The manufacturing method of a substrate provided with semiconductor films according to claim 22, wherein the base substrate is aluminosilicate glass, aluminoborosilicate glass, barium borosilicate glass, quartz, ceramic, or sapphire.

25. The manufacturing method of a substrate provided with semiconductor films according to claim 1, wherein each of the plurality of single crystal semiconductor substrates is disposed in the plurality of depression portions, respectively.

26. The manufacturing method of a substrate provided with semiconductor films according to claim 1, wherein the second tray has the same size as the base substrate.

27. The manufacturing method of a substrate provided with semiconductor films according to claim 1, wherein the first tray and the second tray are a same tray or different trays.

28. The manufacturing method of a substrate provided with semiconductor films according to claim 1, wherein the bonding layer is formed by chemical vapor deposition method using tetraethoxysilane (TEOS) (chemical formula: $Si(OC_2H_5)_4$).

29. The manufacturing method of a substrate provided with semiconductor films according to claim 1, wherein when n is 1, each of the plurality of depression portions of the first tray and the second tray has a size which is a region of one shot of the light-exposing region of the reduced projection exposure apparatus.

30. The manufacturing method of a substrate provided with semiconductor films according to claim 1, wherein the bonding layer includes hydrogen.

31. The manufacturing method of a substrate provided with semiconductor films according to claim 1, wherein the insulating layer includes a film selected from the group consisting of a silicon nitride film, a silicon nitride oxide film, an aluminum nitride film, and an aluminum nitride oxide film.

32. The manufacturing method of a substrate provided with semiconductor films according to claim 4, wherein each of the plurality of single crystal semiconductor substrates is disposed in the plurality of depression portions, respectively.

33. The manufacturing method of a substrate provided with semiconductor films according to claim 4, wherein the fourth tray has the same size as the base substrate.

34. The manufacturing method of a substrate provided with semiconductor films according to claim 4, wherein the first tray, the second tray, and the third tray are a same tray or different trays.

35. The manufacturing method of a substrate provided with semiconductor films according to claim 4, wherein the bonding layer is formed by chemical vapor deposition method using tetraethoxysilane (TEOS) (chemical formula: $Si(OC_2H_5)_4$).

36. The manufacturing method of a substrate provided with semiconductor films according to claim 4, wherein the third tray and the fourth tray are a same tray or different trays.

37. The manufacturing method of a substrate provided with semiconductor films according to claim 4, wherein a step of irradiating the plurality of single crystal semiconductor substrates with the ions is performed by an ion doping apparatus.

38. The manufacturing method of a substrate provided with semiconductor films according to claim 4, wherein when n is 1, each of the plurality of depression portions of the first tray, the second tray, the third tray, and the fourth tray has a size which is a region of one shot of the light-exposing region of the reduced projection exposure apparatus.

39. The manufacturing method of a substrate provided with semiconductor films according to claim 4, wherein the bonding layer includes hydrogen.

40. The manufacturing method of a substrate provided with semiconductor films according to claim 4, wherein the insulating layer includes a film selected from the group consisting of a silicon nitride film, a silicon nitride oxide film, an aluminum nitride film, and an aluminum nitride oxide film.

41. The manufacturing method of a substrate provided with semiconductor films according to claim 7, wherein each of the plurality of single crystal semiconductor substrates is disposed in the plurality of depression portions, respectively.

42. The manufacturing method of a substrate provided with semiconductor films according to claim 7, wherein the fourth tray has the same size as the base substrate.

43. The manufacturing method of a substrate provided with semiconductor films according to claim 7, wherein the first tray, the second tray, and the third tray are a same tray or different trays.

44. The manufacturing method of a substrate provided with semiconductor films according to claim 7, wherein the bonding layer is formed by chemical vapor deposition method using tetraethoxysilane (TEOS) (chemical formula: $Si(OC_2H_5)_4$).

45. The manufacturing method of a substrate provided with semiconductor films according to claim 7, wherein the third tray and the fourth tray are a same tray or different trays.

46. The manufacturing method of a substrate provided with semiconductor films according to claim 7, wherein a step of irradiating the plurality of single crystal semiconductor substrates with the ions is performed by an ion doping apparatus.

47. The manufacturing method of a substrate provided with semiconductor films according to claim 7, wherein when n is 1, each of the plurality of depression portions of the first tray, the second tray, the third tray, and the fourth tray has a size which is a region of one shot of the light-exposing region of the reduced projection exposure apparatus.

48. The manufacturing method of a substrate provided with semiconductor films according to claim 7, wherein the bonding layer includes hydrogen.

49. The manufacturing method of a substrate provided with semiconductor films according to claim 7, wherein the insulating layer includes a film selected from the group consisting of a silicon nitride film, a silicon nitride oxide film, an aluminum nitride film, and an aluminum nitride oxide film.

50. The manufacturing method of a substrate provided with semiconductor films according to claim 10, wherein each of the plurality of single crystal semiconductor substrates is disposed in the plurality of depression portions, respectively.

51. The manufacturing method of a substrate provided with semiconductor films according to claim 10, wherein the fourth tray has the same size as the base substrate.

52. The manufacturing method of a substrate provided with semiconductor films according to claim 10, wherein the first tray, the second tray, and the third tray are a same tray or different trays.

53. The manufacturing method of a substrate provided with semiconductor films according to claim 10, wherein the bonding layer is formed by chemical vapor deposition method using tetraethoxysilane (TEOS) (chemical formula: $Si(OC_2H_5)_4$).

54. The manufacturing method of a substrate provided with semiconductor films according to claim 10, wherein the third tray and the fourth tray are a same tray or different trays.

55. The manufacturing method of a substrate provided with semiconductor films according to claim 10, wherein a step of irradiating the plurality of single crystal semiconductor substrates with the ions is performed by an ion doping apparatus.

56. The manufacturing method of a substrate provided with semiconductor films according to claim 10, wherein when n is 1, each of the plurality of depression portions of the first tray, the second tray, the third tray, and the fourth tray has a size which is a region of one shot of the light-exposing region of the reduced projection exposure apparatus.

57. The manufacturing method of a substrate provided with semiconductor films according to claim 10, wherein the bonding layer includes hydrogen.

58. The manufacturing method of a substrate provided with semiconductor films according to claim 10, wherein the insulating layer includes a film selected from the group consisting of a silicon nitride film, a silicon nitride oxide film, an aluminum nitride film, and an aluminum nitride oxide film.

59. The manufacturing method of a substrate provided with semiconductor films according to claim 13, wherein each of the plurality of single crystal semiconductor substrates is disposed in the plurality of depression portions, respectively.

60. The manufacturing method of a substrate provided with semiconductor films according to claim 13, wherein the second tray has the same size as the base substrate.

61. The manufacturing method of a substrate provided with semiconductor films according to claim 13, wherein the first tray and the second tray are a same tray or different trays.

62. The manufacturing method of a substrate provided with semiconductor films according to claim 13, wherein the bonding layer is formed by chemical vapor deposition method using tetraethoxysilane (TEOS) (chemical formula: $Si(OC_2H_5)_4$).

63. The manufacturing method of a substrate provided with semiconductor films according to claim 13, wherein when n is 1, each of the plurality of depression portions of the first tray and the second tray has a size which is a region of one shot of the light-exposing region of the reduced projection exposure apparatus.

64. The manufacturing method of a substrate provided with semiconductor films according to claim 13, wherein the bonding layer includes hydrogen.

65. The manufacturing method of a substrate provided with semiconductor films according to claim 13, wherein the insulating layer includes a film selected from the group consisting of a silicon nitride film, a silicon nitride oxide film, an aluminum nitride film, and an aluminum nitride oxide film.

66. The manufacturing method of a substrate provided with semiconductor films according to claim 13, wherein the insulating layer includes fluorine.

67. The manufacturing method of a substrate provided with semiconductor films according to claim 16, wherein each of the plurality of single crystal semiconductor substrates is disposed in the plurality of depression portions, respectively.

68. The manufacturing method of a substrate provided with semiconductor films according to claim 16, wherein the fourth tray has the same size as the base substrate.

69. The manufacturing method of a substrate provided with semiconductor films according to claim 16, wherein the first tray, the second tray, and the third tray are a same tray or different trays.

70. The manufacturing method of a substrate provided with semiconductor films according to claim 16, wherein the bonding layer is formed by chemical vapor deposition method using tetraethoxysilane (TEOS) (chemical formula: $Si(OC_2H_5)_4$).

71. The manufacturing method of a substrate provided with semiconductor films according to claim 16, wherein the third tray and the fourth tray are a same tray or different trays.

72. The manufacturing method of a substrate provided with semiconductor films according to claim 16, wherein a step of irradiating the plurality of single crystal semiconductor substrates with the ions is performed by an ion doping apparatus.

73. The manufacturing method of a substrate provided with semiconductor films according to claim 16, wherein when n is 1, each of the plurality of depression portions of the first tray, the second tray, the third tray, and the fourth tray has a size which is a region of one shot of the light-exposing region of the reduced projection exposure apparatus.

74. The manufacturing method of a substrate provided with semiconductor films according to claim 16, wherein the bonding layer includes hydrogen.

75. The manufacturing method of a substrate provided with semiconductor films according to claim 16, wherein the insulating layer includes a film selected from the group consisting of a silicon nitride film, a silicon nitride oxide film, an aluminum nitride film, and an aluminum nitride oxide film.

76. The manufacturing method of a substrate provided with semiconductor films according to claim 16, wherein the insulating layer includes fluorine.

77. The manufacturing method of a substrate provided with semiconductor films according to claim 19, wherein each of the plurality of single crystal semiconductor substrates is disposed in the plurality of depression portions, respectively.

78. The manufacturing method of a substrate provided with semiconductor films according to claim 19, wherein the fourth tray has the same size as the base substrate.

79. The manufacturing method of a substrate provided with semiconductor films according to claim 19, wherein the first tray, the second tray, and the third tray are a same tray or different trays.

80. The manufacturing method of a substrate provided with semiconductor films according to claim 19, wherein the bonding layer is formed by chemical vapor deposition method using tetraethoxysilane (TEOS) (chemical formula: $Si(OC_2H_5)_4$).

81. The manufacturing method of a substrate provided with semiconductor films according to claim 19, wherein the third tray and the fourth tray are a same tray or different trays.

82. The manufacturing method of a substrate provided with semiconductor films according to claim 19, wherein a step of irradiating the plurality of single crystal semiconductor substrates with the ions is performed by an ion doping apparatus.

83. The manufacturing method of a substrate provided with semiconductor films according to claim 19, wherein when n is 1, each of the plurality of depression portions of the first tray, the second tray, the third tray, and the fourth tray has a size which is a region of one shot of the light-exposing region of the reduced projection exposure apparatus.

84. The manufacturing method of a substrate provided with semiconductor films according to claim 19, wherein the bonding layer includes hydrogen.

85. The manufacturing method of a substrate provided with semiconductor films according to claim 19, wherein the insulating layer includes a film selected from the group consisting of a silicon nitride film, a silicon nitride oxide film, an aluminum nitride film, and an aluminum nitride oxide film.

86. The manufacturing method of a substrate provided with semiconductor films according to claim 19, wherein the insulating layer includes fluorine.

87. The manufacturing method of a substrate provided with semiconductor films according to claim 22, wherein each of the plurality of single crystal semiconductor substrates is disposed in the plurality of depression portions, respectively.

88. The manufacturing method of a substrate provided with semiconductor films according to claim 22, wherein the fourth tray has the same size as the base substrate.

89. The manufacturing method of a substrate provided with semiconductor films according to claim 22, wherein the first tray, the second tray, and the third tray are a same tray or different trays.

90. The manufacturing method of a substrate provided with semiconductor films according to claim 22, wherein the bonding layer is formed by chemical vapor deposition method using tetraethoxysilane (TEOS) (chemical formula: $Si(OC_2H_5)_4$).

91. The manufacturing method of a substrate provided with semiconductor films according to claim 22, wherein the third tray and the fourth tray are a same tray or different trays.

92. The manufacturing method of a substrate provided with semiconductor films according to claim 22, wherein a step of irradiating the plurality of single crystal semiconductor substrates with the ions is performed by an ion doping apparatus.

93. The manufacturing method of a substrate provided with semiconductor films according to claim 22, wherein when n is 1, each of the plurality of depression portions of the first tray, the second tray, the third tray, and the fourth tray has a size which is a region of one shot of the light-exposing region of the reduced projection exposure apparatus.

94. The manufacturing method of a substrate provided with semiconductor films according to claim 22, wherein the bonding layer includes hydrogen.

95. The manufacturing method of a substrate provided with semiconductor films according to claim 22, wherein the insulating layer includes a film selected from the group consisting of a silicon nitride film, a silicon nitride oxide film, an aluminum nitride film, and an aluminum nitride oxide film.

96. The manufacturing method of a substrate provided with semiconductor films according to claim 22, wherein the insulating layer includes fluorine.

* * * * *